United States Patent
Toda

(10) Patent No.: US 11,424,284 B2
(45) Date of Patent: Aug. 23, 2022

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 349 days.

(21) Appl. No.: 16/486,952

(22) PCT Filed: Mar. 1, 2018

(86) PCT No.: PCT/JP2018/007703
§ 371 (c)(1),
(2) Date: Aug. 19, 2019

(87) PCT Pub. No.: WO2018/159738
PCT Pub. Date: Sep. 7, 2018

(65) Prior Publication Data
US 2020/0013819 A1    Jan. 9, 2020

(30) Foreign Application Priority Data

Mar. 3, 2017 (JP) .............................. JP2017-040132

(51) Int. Cl.
*H01L 27/146* (2006.01)
*G02B 5/30* (2006.01)
*H04N 5/369* (2011.01)

(52) U.S. Cl.
CPC .......... *H01L 27/14643* (2013.01); *G02B 5/30* (2013.01); *H01L 27/14603* (2013.01); *H04N 5/3696* (2013.01); *H01L 27/14621* (2013.01)

(58) Field of Classification Search
CPC ......... H01L 27/14643; H01L 27/14603; H01L 27/14621; H01L 27/14625; H01L 31/0232;
(Continued)

(56) References Cited

U.S. PATENT DOCUMENTS

2012/0319222 A1* 12/2012 Ozawa .............. H01L 27/14605
257/432
2015/0212294 A1   7/2015 Imamura et al.
2016/0037022 A1* 2/2016 Matsuzaki ............. H04N 5/332
348/335

FOREIGN PATENT DOCUMENTS

JP    2009-162847 A    7/2009
JP    2017-017563 A    1/2017
(Continued)

OTHER PUBLICATIONS

Machine Translation of JP2009-162847 (Year: 2009).*
(Continued)

*Primary Examiner* — Shahed Ahmed
*Assistant Examiner* — Sun Mi Kim King
(74) *Attorney, Agent, or Firm* — Chip Law Group

(57) ABSTRACT

The present disclosure relates to a solid-state imaging device and an electronic apparatus that make it possible to estimate a normal vector to one direction with high accuracy with a simple configuration. A polarization image sensor includes a plurality of polarizers disposed on a chip and having different polarization directions, and a plurality of photoelectric conversion sections having light reception regions for receiving light transmitted through the polarizers, the light reception regions being symmetrical. The present disclosure can be applied, for example, to a polarization image sensor or the like that estimates a surface and a shape of an imaging object.

17 Claims, 22 Drawing Sheets

(58) Field of Classification Search
CPC . H04N 5/3696; G02B 5/30; G01J 4/04; G01J 4/00

See application file for complete search history.

(56) References Cited

FOREIGN PATENT DOCUMENTS

| | | |
|---|---|---|
| WO | 2015/015717 A1 | 2/2015 |
| WO | 2017/002715 A1 | 1/2017 |

OTHER PUBLICATIONS

International Search Report and Written Opinion of PCT Application No. PPCT/JP2018/007703, dated Mar. 15, 2018, 09 pages of ISRWO.

* cited by examiner

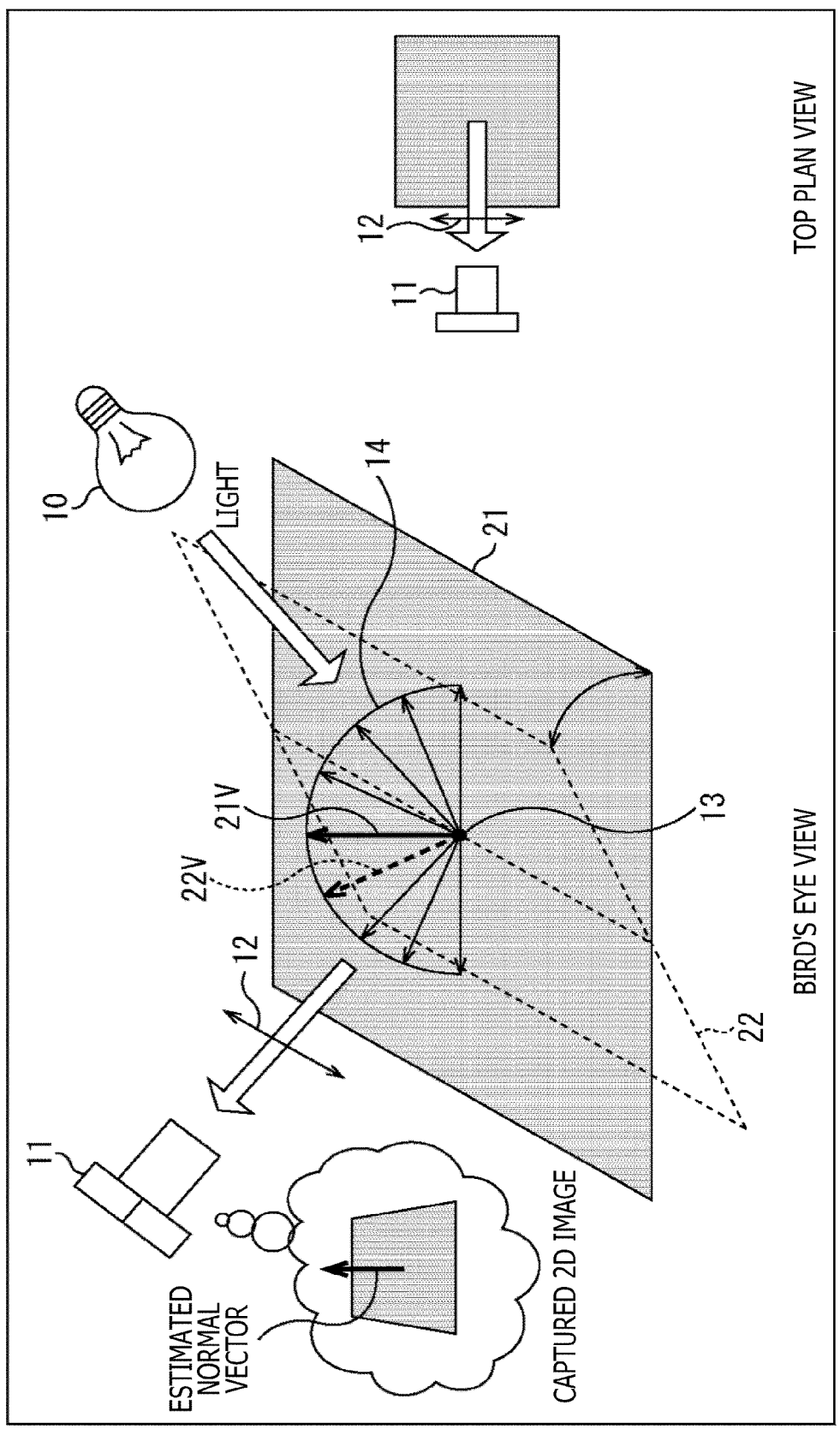

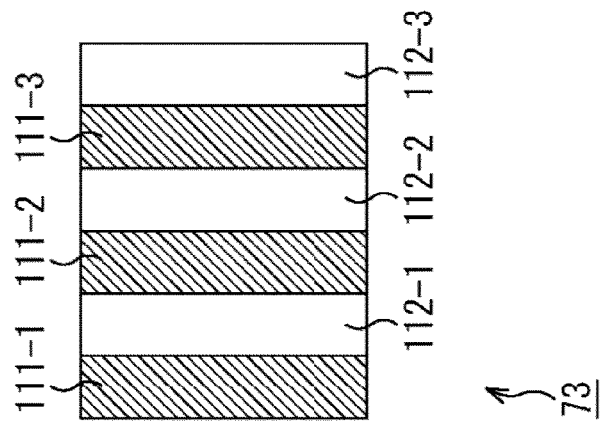
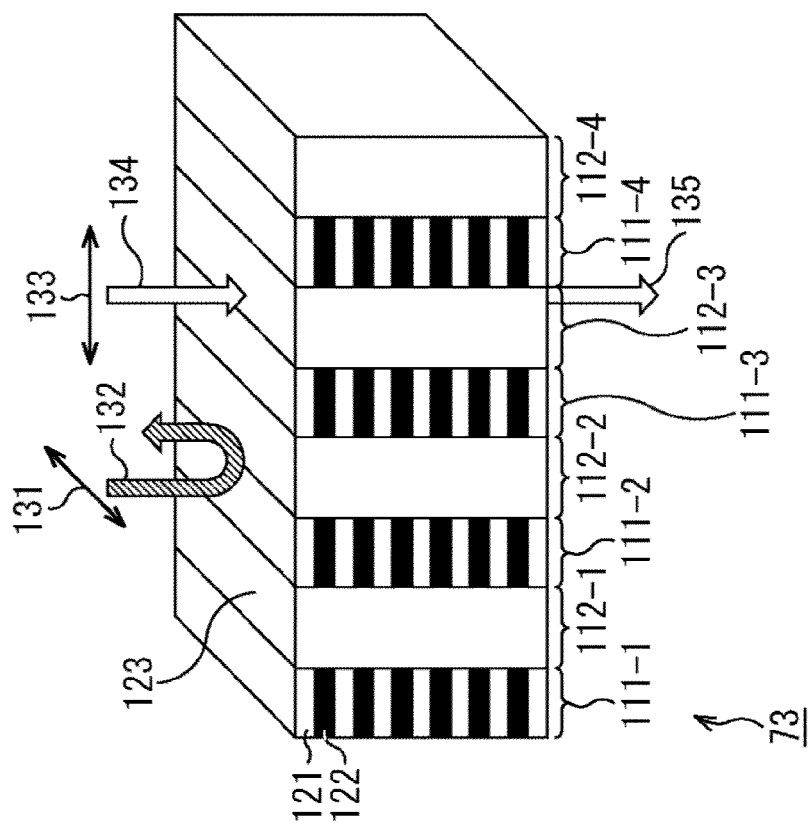

SOLID-STATE IMAGING DEVICE AND ELECTRONIC APPARATUS

CROSS REFERENCE TO RELATED APPLICATIONS

This application is a U.S. National Phase of International Patent Application No. PCT/JP2018/007703 filed on Mar. 1, 2018, which claims priority benefit of Japanese Patent Application No. JP 2017-040132 filed in the Japan Patent Office on Mar. 3, 2017. Each of the above-referenced applications is hereby incorporated herein by reference in its entirety.

TECHNICAL FIELD

The present disclosure relates to a solid-state imaging device and an electronic apparatus, and particularly to a solid-state imaging device and an electronic apparatus capable of estimating a normal vector in one direction with high accuracy with a simple configuration.

BACKGROUND ART

A polarization image sensor detects a normal vector on an imaging object surface by detection of a polarization detection and analyzes a surface shape. For example, by placing a polarizer on each of pixels of an image sensor, it is possible to acquire a polarization image and signals of four polarizations and estimate the polarization direction from phase differences between the signals.

However, as described also in NPL 1, even if the polarization direction is estimated in a 2D image captured from a certain direction, it is not possible to determine the normal vector to one. This is because, although it can be estimated that a normal vector has an end point in a circumferential direction from a start point given by a certain one point, it is not determined in which one of directions the normal vector exists.

Further, although a method of determining a normal vector by approximation by multiple reflection and signal processing is available (for example, refer to PTL 1), according to this method, the error is great.

CITATION LIST

Patent Literature

[PTL 1]
  PCT Patent Publication No. WO2011/070708

Non Patent Literature

[NPL 1]
  Daisuke MIYAZAKI, "Shape estimation and analysis of color by polarization," The 127th Microoptics Meeting "3D space information and microoptics," 2013.3.7, Microoptics research group paper MICROOPTICS NEWS Vol. 31 No. 1

SUMMARY

Technical Problem

The present disclosure has been made in view of such a situation as described above, and makes it possible to estimate a normal vector to one direction with high accuracy with a simple configuration.

Solution to Problem

A solid-state imaging device according to a first aspect of the present disclosure includes a plurality of polarizers disposed on a chip and having different polarization directions, and a plurality of photoelectric conversion sections having light reception regions for receiving light transmitted through the polarizers, the light reception regions being symmetrical.

An electronic apparatus according to a second aspect of the present disclosure includes a solid-state imaging device including a plurality of polarizers disposed on a chip and having different polarization directions and a plurality of photoelectric conversion sections having light reception regions for receiving light transmitted through the polarizers, the light reception regions being symmetrical.

In the first and second aspects of the present disclosure, a plurality of polarizers disposed on a chip and having different polarization directions and a plurality of photoelectric conversion sections having light reception regions for receiving light transmitted through the polarizers, the light reception regions being symmetrical, are provided.

The solid-state imaging device and the electronic apparatus may each be an independent device or apparatus or may be a module incorporated in a different apparatus.

Advantageous Effect of Invention

With the first and second aspects of the present disclosure, a normal vector can be estimated to one direction with high accuracy with a simple configuration.

It is to be noted that the effect described here is not necessarily restrictive and may be one of effects described in the present disclosure.

BRIEF DESCRIPTION OF DRAWINGS

FIG. 2 is a view illustrating a concept of the polarization image sensor of the present disclosure.

FIGS. 5A and 5B are views depicting a first example of a configuration of a polarizer layer.

DESCRIPTION OF EMBODIMENTS

In the following, modes (hereinafter referred to as embodiments) for carrying out the technology according to the present disclosure (present technology) are described. It is to be noted that the description is given in accordance with the following order.

1. Concept of Polarization Image Sensor of Present Disclosure
2. First Embodiment of Polarization Image Sensor
3. Second Embodiment of Polarization Image Sensor
4. Third Embodiment of Polarization Image Sensor
5. Fourth Embodiment of Polarization Image Sensor
6. Example of Application to Electronic Apparatus
7. Example of Application to Biometric Authentication Device
8. Example of Application to In-Vivo Information Acquisition System
9. Example of Application to Endoscopic Surgery System
10. Application Example to Moving Body <1. Concept of Polarization Image Sensor of Present Disclosure>

First, a concept of the polarization image sensor of the present disclosure is described in comparison with a general polarization image sensor with reference to FIGS. 1A, 1B, 2, and 3.

Figure 1A:
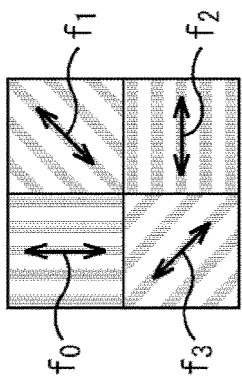
FIGS. 1A and 1B are views illustrating a concept of a polarization image sensor of the present disclosure.
Figure 1B:
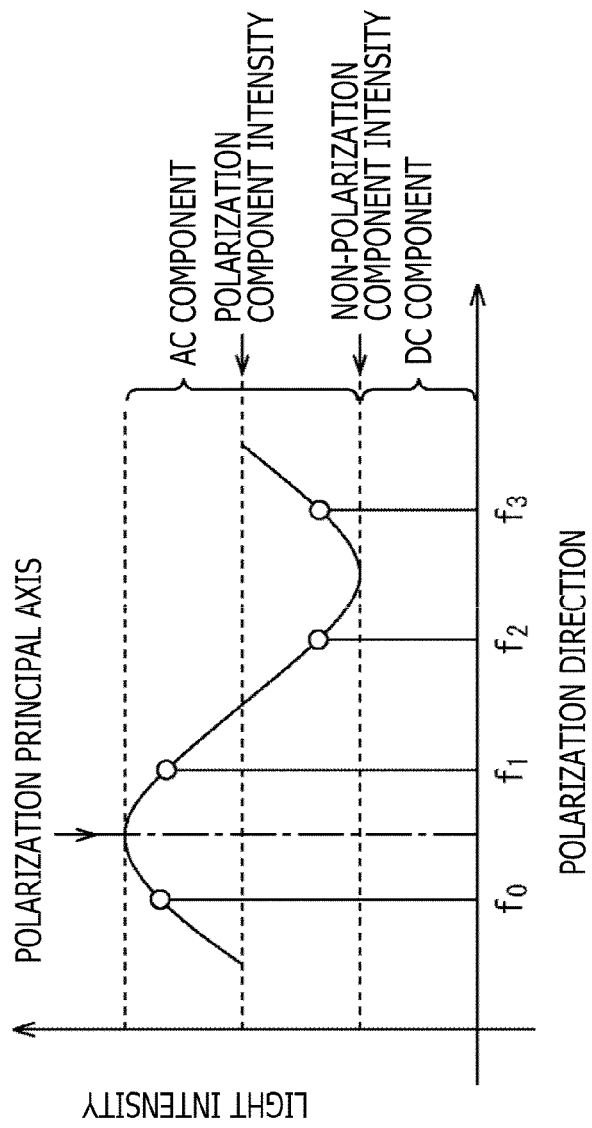

The polarization image sensor detects normal vectors on an imaging object surface by detection of a polarization direction to analyze a shape of the surface. For example, as depicted in FIG. 1A, by acquiring polarization information of four polarization directions different from each other using an image sensor for any of polarization directions f0 to f3 disposed in each of pixels, a sum of a direct current component that does not indicate a difference among the polarizations and alternating current components that indicate a difference among the polarizations can be estimated as depicted in FIG. 1B. By Fourier analyzing the intensity of the sum, information of a non-polarization component intensity, a polarization component intensity, and a polarization principal axis direction is obtained and, as a result, it is possible to estimate normal vectors on the imaging object surface to be imaged and estimate the surface and the shape of the imaging object.

However, as depicted in FIG. 2, in the case where a polarization direction 12 is estimated in a 2D image obtained by imaging an imaging object illuminated with a light source 10 from a predetermined one direction by a polarization camera 11 in which the polarizers depicted in FIG. 1A are disposed, although it can be estimated that a normal vector exists in a circumferential direction 14 orthogonal to the polarization direction 12 from a start point given by a certain one point 13, it cannot be determined in which one of directions the normal vector exists.

For example, it cannot be distinguished whether the normal vector is a normal vector 21V indicated by a solid line in such disposition as indicated by a plane 21 or is a normal vector 22V indicated by a broken line in such disposition as indicated by a plane 22 that is inclined with respect to the plane 21. Therefore, there is a problem that the inclination of an imaging object plane is not known.

Therefore, although a method is available in which a normal vector is determined by approximation by multiple reflection and signal processing as disclosed, for example, in PTL 1, according to this method, the error is great.

Figure 3:
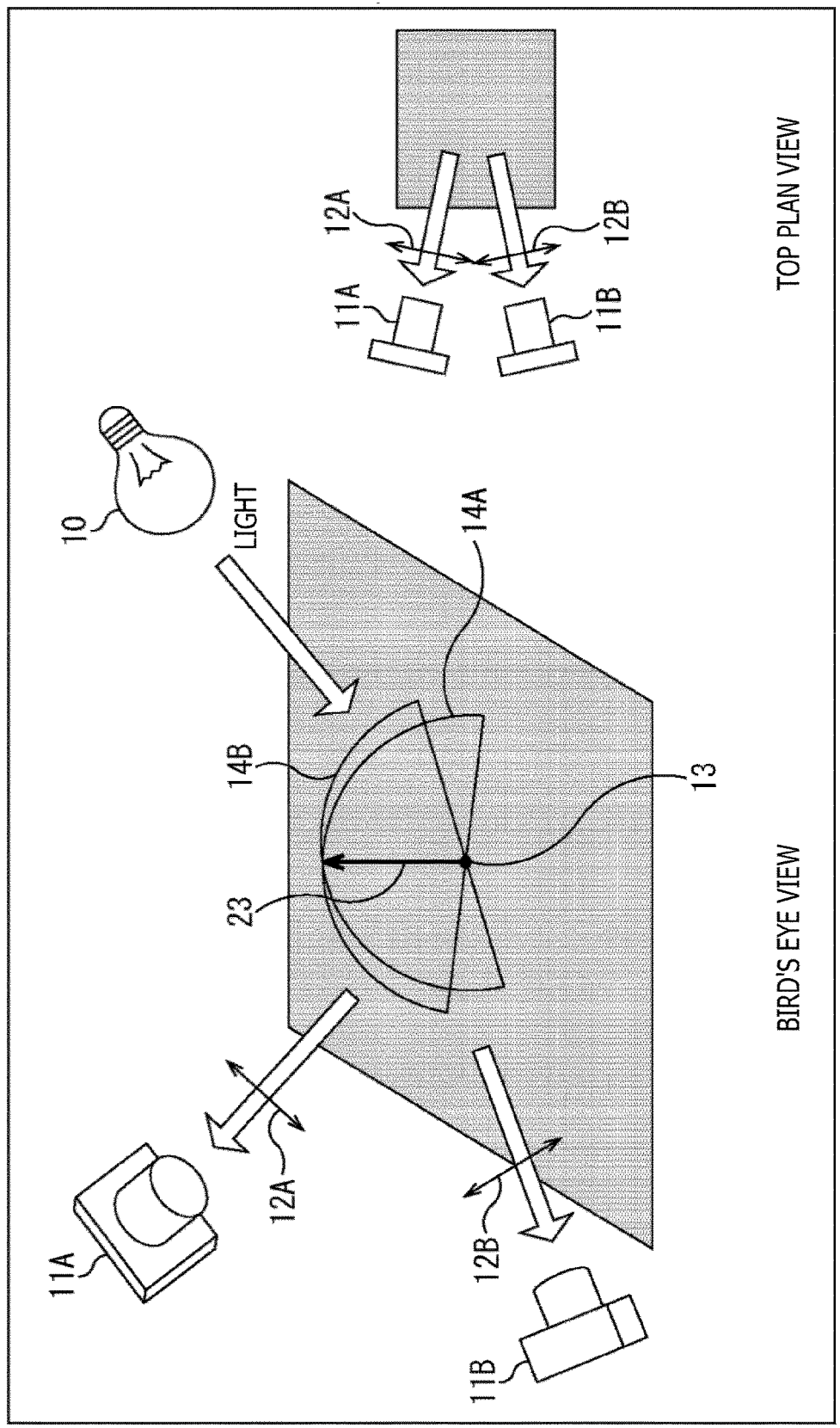
FIG. 3 is a view illustrating a concept of the polarization image sensor of the present disclosure.

In contrast, FIG. 3 depicts a detection principle of a normal vector implemented by the polarization image sensor of the present disclosure.

According to the polarization image sensor of the present disclosure, conceptually a 2D image is captured by polarization cameras 11A and 11B disposed in two directions different from each other and polarization directions 12A and 12B are estimated. Then, it can be estimated from the polarization direction 12A that a normal vector exists in a circumferential direction 14A orthogonal to the polarization direction 12A from a start point given by a certain one point 13 and it can be estimated from the polarization direction 12B that a normal vector exists in a circumferential direction 14B orthogonal to the polarization direction 12B from a start point given by a certain one point 13. As a result, one normal vector 23 can be determined from the two circumferential directions 14A and 14B.

According to the polarization image sensor of the present disclosure, a normal vector can be estimated by a geometrical method in such a manner.

<2. First Embodiment of Polarization Image Sensor>

Figure 4:
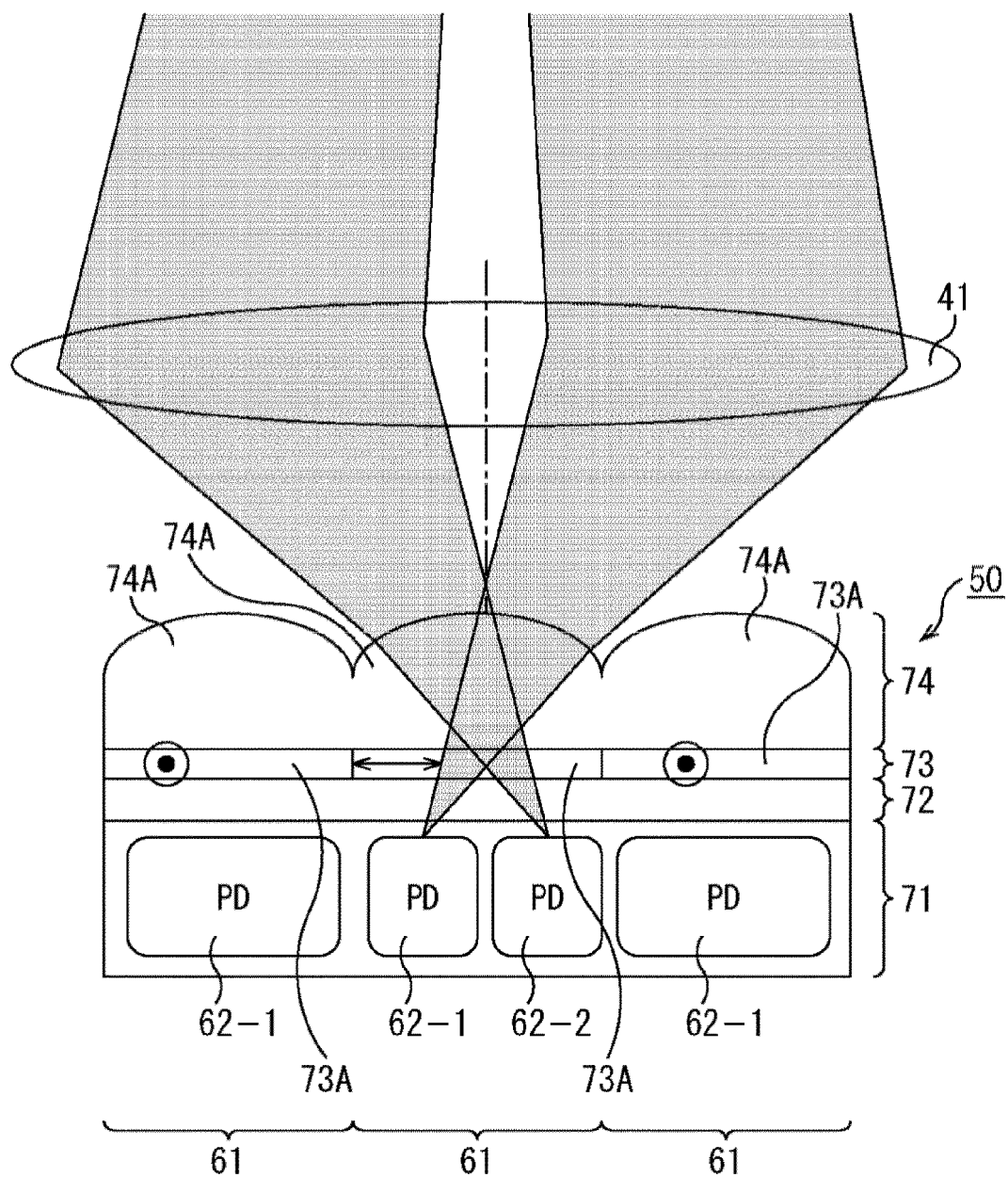
FIG. 4 is a sectional view depicting a first embodiment of the polarization image sensor of the present disclosure.

FIG. 4 depicts a sectional view of a polarization image sensor 50 as a first embodiment of the polarization image sensor (solid-state imaging device) of the present disclosure that implements the detection principle described with reference to FIG. 3.

The polarization image sensor 50 includes a pixel array section in which a plurality of pixels 61 is disposed in a matrix, and FIG. 4 depicts a sectional view of three pixels adjacent each other in one direction from among the plurality of pixels 61.

In the polarization image sensor 50, two PDs (photodiodes) 62-1 and 62-2 are formed for each of the pixels 61 in a semiconductor layer (semiconductor chip) 71 configured from a silicon substrate or the like. The two PDs 62-1 and 62-2 are formed such that a PD of a pixel of a general image sensor is divided into two such that the divisional PDs are symmetric to each other in a predetermined direction. The two PDs 62-1 and 62-2 of the center pixel 61 from among the three pixels 61 depicted in FIG. 4 are formed symmetrical to each other in a horizontal direction, and the two PDs 62-1 and 62-2 (PD 62-2 is not depicted) of each of the pixels 61 at the right end and the left end are formed symmetrical to each other in a depthwise direction (perpendicular direction to the plane of the figure).

A flattened film 72, a polarizer layer 73, and an OCL layer 74 are formed on the upper side of a semiconductor layer 71 that is a light incident side. The flattened film 72 is formed by forming an inorganic film such as, for example, a $SiO_2$ film and being flattened by CMP (Chemical Mechanical Polishing). In the polarizer layer 73, a polarizer 73A having a polarization direction set in a unit of a pixel is formed for each pixel. In the OCL layer 74, an OCL (on chip lens) 74A having a substantially spherical shape is formed for each pixel. Not only a fully spherical shape but also a non-spherical shape are included in the substantially spherical shape. The OCL layer 74 is formed, for example, from a silicon nitride film (SiN) or a resin material such as styrene-based resin, acrylic-based resin, styrene-acrylic copolymer-based resin, or siloxane-based resin.

The polarizer 73A transmits only light of a predetermined polarization direction (polarization wave) from within light incident through an imaging lens 41. The polarization direction of light to be transmitted by the polarizer 73A is any of the four polarization directions f0 to f3 depicted in FIG. 1A, and of which polarization direction light is transmitted differs for each pixel 61. For example, the polarizer 73A of the central pixel 61 from among the three central pixels 61 depicted in FIG. 4 transmits a polarization wave of a horizontal direction (polarization direction f2), and the two polarizers 73A of the central pixels 61 on the right and left ends transmit a polarization wave of a depthwise direction (polarization direction f0).

FIGS. 5A and 5B depict a first example of a configuration of the polarizer layer 73.

FIG. 5A is a bird's-eye view of the polarizer layer 73 and FIG. 5B is a plan view of the polarizer layer 73 from the light incident side.

The polarizer layer 73 depicted in FIG. 5A is a photonic crystal type polarizer having a structure in which a plurality of grooved portions in a predetermined direction is formed in parallel to each other at predetermined intervals on a multilayer film. The polarizer layer 73 blocks polarization light in which an electric field oscillates in a predetermined direction and transmits polarization light in which an electric field oscillates in a perpendicular direction to the predetermined direction. Light is incident from a plane on the upper side of the polarizer layer 73 in FIGS. 5A and 5B, and is emitted from a plane (not depicted) on the lower side. As depicted in FIG. 5A, the polarizer layer 73 is formed from multilayer films 111-1 to 111-4 and grooved portions 112-1 to 112-4. In the following description, where the multilayer films 111-1 to 111-4 need not be described in a distinguished relationship from one another, the multilayer films 111-1 to 111-4 are referred to each as multilayer film 111. Further, where the grooved portions 112-1 to 112-4 need not be described in a distinguished relationship from one another, the grooved portions 112-1 to 112-4 are referred to each as grooved portion 112.

As depicted in FIG. 5, each multilayer film 111 is structured such that an $SiO_2$ film 121 formed from silicon dioxide ($SiO_2$) and a $TiO_2$ film 122 formed from titanium oxide ($TiO_2$) are stacked alternately in a direction from an incident face of light toward an emission face. Accordingly, the multilayer film 111 is referred to also as $TiO_2/SiO_2$ multilayer film. Further, in each grooved portion 112, $SiO_2$ is filled to form a $SiO_2$ film 123.

The multilayer film 111 can be fabricated by first performing vapor deposition, for example, for all pixels of the polarization image sensor 5, for example, by a sputtering method to form a $TiO_2/SiO_2$ multilayer film, forming a grooved portion 112 using lithography and RIE (Reactive Ion Etching) processing or the like and then filling $SiO_2$ in the grooved portion 112 to form the $SiO_2$ film 123.

Each grooved portion 112 is formed such that the direction of a double-sided arrow mark 131 as a longitudinal direction thereof, and the grooved portions 112-1 to 112-4 are formed in parallel to each other at predetermined distances. In other words, also each multilayer film 111 is formed such that the direction of the double-sided arrow mark 131 is a longitudinal direction thereof, and the multilayer films 111-1 to 111-4 are formed in parallel to each other at predetermined distances. Accordingly, where the polarizer layer 73 is viewed from the light incident side, it has such a configuration as depicted in FIG. 5B in which the multilayer film 111 and the grooved portion 112 are disposed alternately.

If a polarization wave in the longitudinal direction (directions of the double-sided arrow mark 131) of a grooved portion 112 is a TE wave, then the TE wave is reflected on the light incident face of the polarizer layer 73 as indicated by an arrow mark 132. Further, if a polarization wave in directions of a double-sided arrow mark 133 perpendicular to the direction of the double-sided arrow mark 131 is a TM wave, then the TM wave incident as indicated by an arrow mark 134 transmits through the polarizer layer 73 and is emitted from an emission face (not depicted) of the polarizer layer 73 as indicated by an arrow mark 135.

In this manner, the polarizer layer 73 can transmit and extract a polarization wave (TM wave) of the direction of the double-sided arrow mark 133. In short, polarization light (polarization information) in which an electric field oscillates in the direction of the double-sided arrow mark 133 can be extracted.

It is to be noted that, while, in the example described above, the multilayer film 111 is formed as a dielectric multilayer film from the $SiO_2$ films 121 and the $TiO_2$ films 122, the configuration is not limited to this. In particular, it is sufficient that the multilayer film 111 has a structure in which a plurality of films having refractive indexes different from each other is stacked in a direction from the light incident face toward the light emission face. For example, as the multilayer film 111, a structure in which $SiO_2$ films having a low refractive index and $Si_3N_4$ films having a refractive index higher than that of the $SiO_2$ film are stacked, another structure in which $SiO_2$ films having a low refractive index and $TaO_2$ films having a refractive index higher than that of the $SiO_2$ film are stacked and so forth can be adopted.

Also the material for forming the grooved portion 112 is arbitrary. For example, in place of $SiO_2$, some other material having a low refractive index may be filled into the grooved portion 112. Further, for example, nothing may be filled into the grooved portion 112 such that the grooved portion 112 remains as a cavity (air gap). Further, for example, a material having a high refractive index may be filled into the grooved portion 112.

It is to be noted that the size of the polarizer layer 73 and components of the same is arbitrary. For example, the width (distance between the grooved portions 112) and the length in the longitudinal direction of the multilayer film 111, the width (distance between the multilayer films 111) and the length in the longitudinal direction of the grooved portion 112, the thickness (length in the advancing direction of transmission light) of the multilayer film 111 and grooved portion 112 and the thickness of the films forming the multilayer film 111 (for example, thickness of the SiO$_2$ films 121 and TiO$_2$ films 122) are arbitrary.

Figure 6:
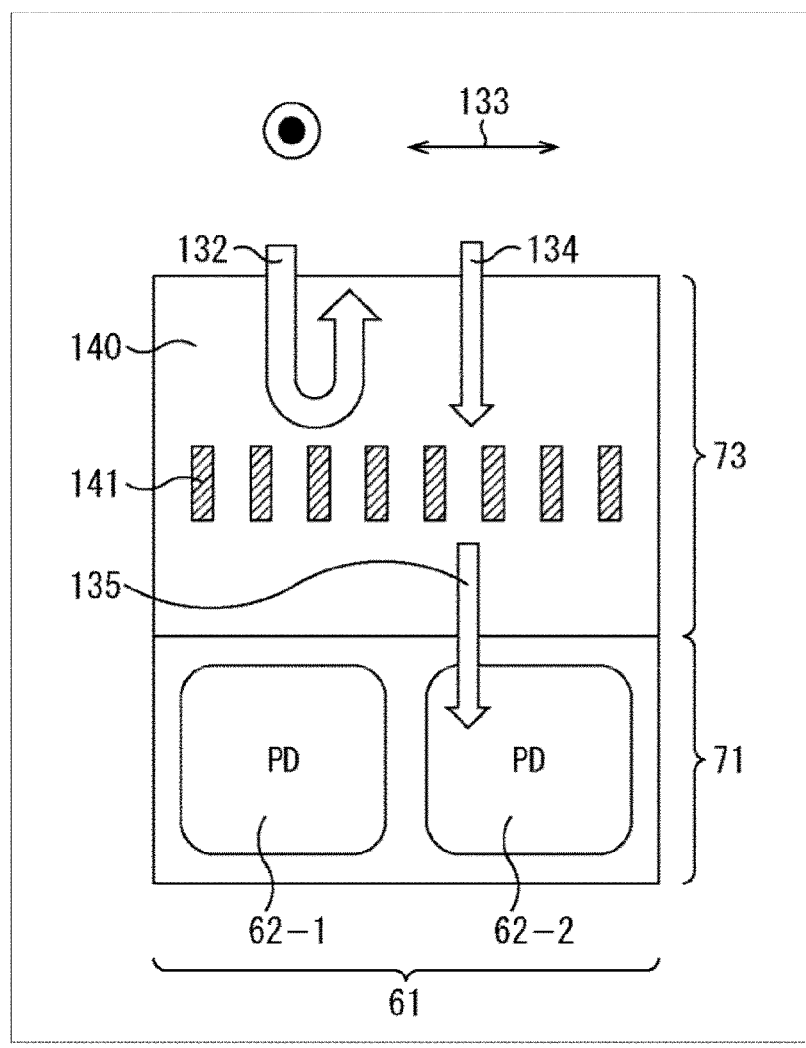
FIG. 6 is a sectional view depicting a second example of a configuration of the polarizer layer.

FIG. 6 is a sectional view depicting a second example of a configuration of the polarizer layer 73. It is to be noted that, in FIG. 6, also the semiconductor layer 71 is depicted together with the polarizer layer 73.

The polarizer layer 73 depicted in FIG. 6 is a wire grid type polarizer, and, in a SiO$_2$ film 140, a plurality of linear metal films 141 long in a predetermined direction is disposed in parallel to each other at predetermined distances. In the example of FIG. 6, the longitudinal direction of each linear metal film 141 is a direction perpendicular to the plane of the figure (direction of the double-sided arrow mark 131 of FIGS. 5A and 5B), and a TM wave that is a polarization wave of the direction of the double-sided arrow mark 133 perpendicular to the direction perpendicular to the plane of the figure enters as indicated by the arrow mark 134 and transmits through the polarizer layer 73 and then is emitted from the emission face of the polarizer layer 73 as indicated by the arrow mark 135 and is inputted to a PD 62-1 or a PD 62-2. A TE wave that is a polarization wave of the longitudinal direction (direction perpendicular to the plane of the figure) of the metal film 141 is reflected as indicated by the arrow mark 132 or is absorbed in the metal film 141.

While the metal film 141 is configured from a metal material such as, for example, Al or W, the metal film 141 need not necessarily be a metal film and it is sufficient that a light blocking material is used. Also the SiO$_2$ film 140 may be formed from some other material or may be configured as a cavity (air gap).

Figure 7:
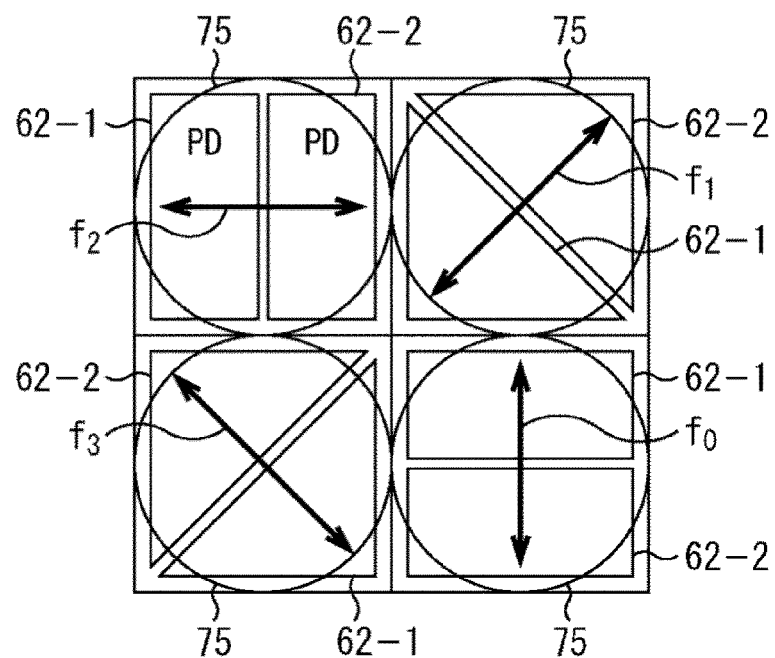
FIG. 7 is a view illustrating a polarization direction of a polarizer and a division direction of a PD.

Although the polarization direction of light to be transmitted through the polarizer 73A in a pixel unit need not necessarily be adjusted so as to coincide with the division direction of the two PDs 62-1 and 62-2 formed in a pixel, as depicted in FIG. 7, it is preferable to make the polarization direction and the division direction coincide with each other. Since to make the polarization direction and the division direction coincide with each other in such a manner increases the sensitivity to the polarization direction of light (S polarization light) reflected on an imaging object, estimation of the normal vector becomes more accurate.

The plurality of pixels 61 included in the polarization image sensor 50 acquires polarization information of the four polarization directions f0 to f3 different from each other as depicted in FIG. 7, and, as a result, the sum of a direct current component that does not indicate a difference among the polarizations and alternating current components that indicate a difference among the polarizations can be estimated as depicted in FIG. 1B. Then, by Fourier analyzing the detected intensities, information of a non-polarization component intensity, a polarization component intensity, and a polarization principal axis direction is obtained and, as a result, a normal vector on an imaging object surface to be imaged can be estimated and the surface and the shape of the imaging object can be estimated.

According to the polarization image sensor 50 of the first embodiment configured in such a manner as described above, light transmitted through the imaging lens 41 is condensed by the OCL 74A formed on each pixel 61 and is incident to any of the two PDs 62-1 and 62-2. In particular, as depicted in FIG. 4, a ray of light incident from the right and a ray of light incident from the left can be received separately by the PD 62-1 and the PD 62-2, respectively. Since photons incident to the PD 62-1 and the PD 62-2 can be converted into electric signals by photoelectric conversion, imaging from two directions is possible.

The two PDs 62-1 and 62-2 formed in each pixel correspond to the polarization camera 11A and the polarization camera 11B disposed in two directions different from each other, respectively, and the detection principle described hereinabove with reference to FIG. 3 can be implemented by the single image sensor 50.

Further, since not only a normal vector can be determined but also a phase difference can be detected by forming the two PDs 62-1 and 62-2 in each pixel, also the distance to an imaging object can be determined by the principle of triangulation. Therefore, by taking also distance information to each point of an imaging object into consideration together, it becomes possible to estimate a particular shape of the imaging object with a high degree of accuracy. Further, the phase difference information can be used also as focus adjustment information for automatic focusing.

Figure 8A:
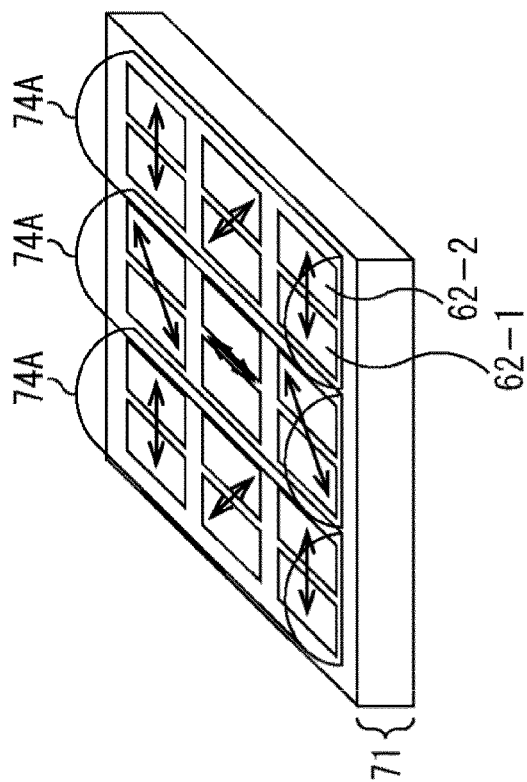
FIGS. 8A and 8B are views illustrating a shape of an OCL.
Figure 8B:
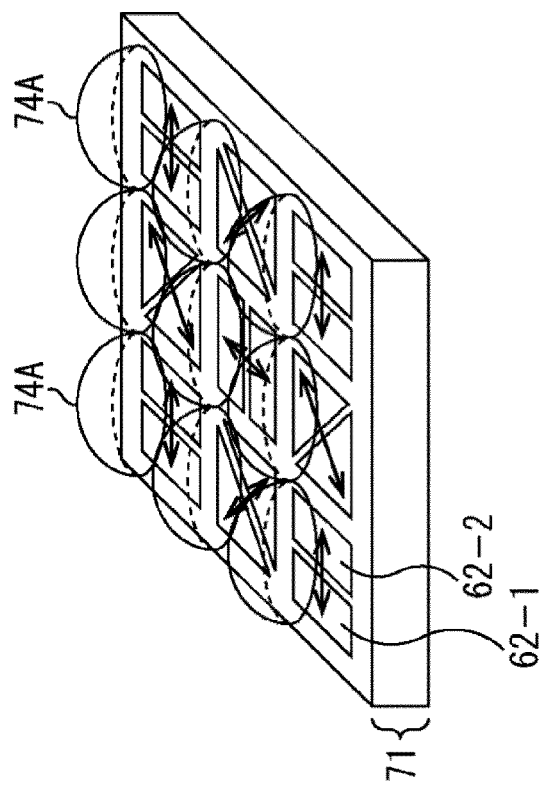

It is to be noted that, although, as the shape of the OCL 74A formed in the OCL layer 74, a shape in which a spherical or aspherical convex shape is formed in a unit of a pixel as depicted in FIG. 8A, a shape of a lenticular type in which a spherical or aspherical convex shape is formed in a unit of a pixel column or in a unit of a pixel row as depicted in FIG. 8B may be adopted. In this case, since a single OCL 74A is formed for a plurality of pixels, one OCL 74A is formed for a plurality of polarization directions.

Further, the number of PDs 62 to be formed divisionally in each pixel need not necessarily be two but may be two or more. In short, it is sufficient if two or more PDs 62 (photoelectric conversion sections) are disposed for one OCL 74A.

As a configuration of a polarization image sensor 50 in which three or more PDs 62 are disposed for one OCL 74A, for example, a configuration is available in which, for example, each pixel 61 has one light reception region (PD 62) and one OCL 74A is formed for four pixels 61 such that the polarization directions of the four pixels 61 under the polarizers 73A are same as each other.

<3. Second Embodiment of Polarization Image Sensor>

Figure 9:
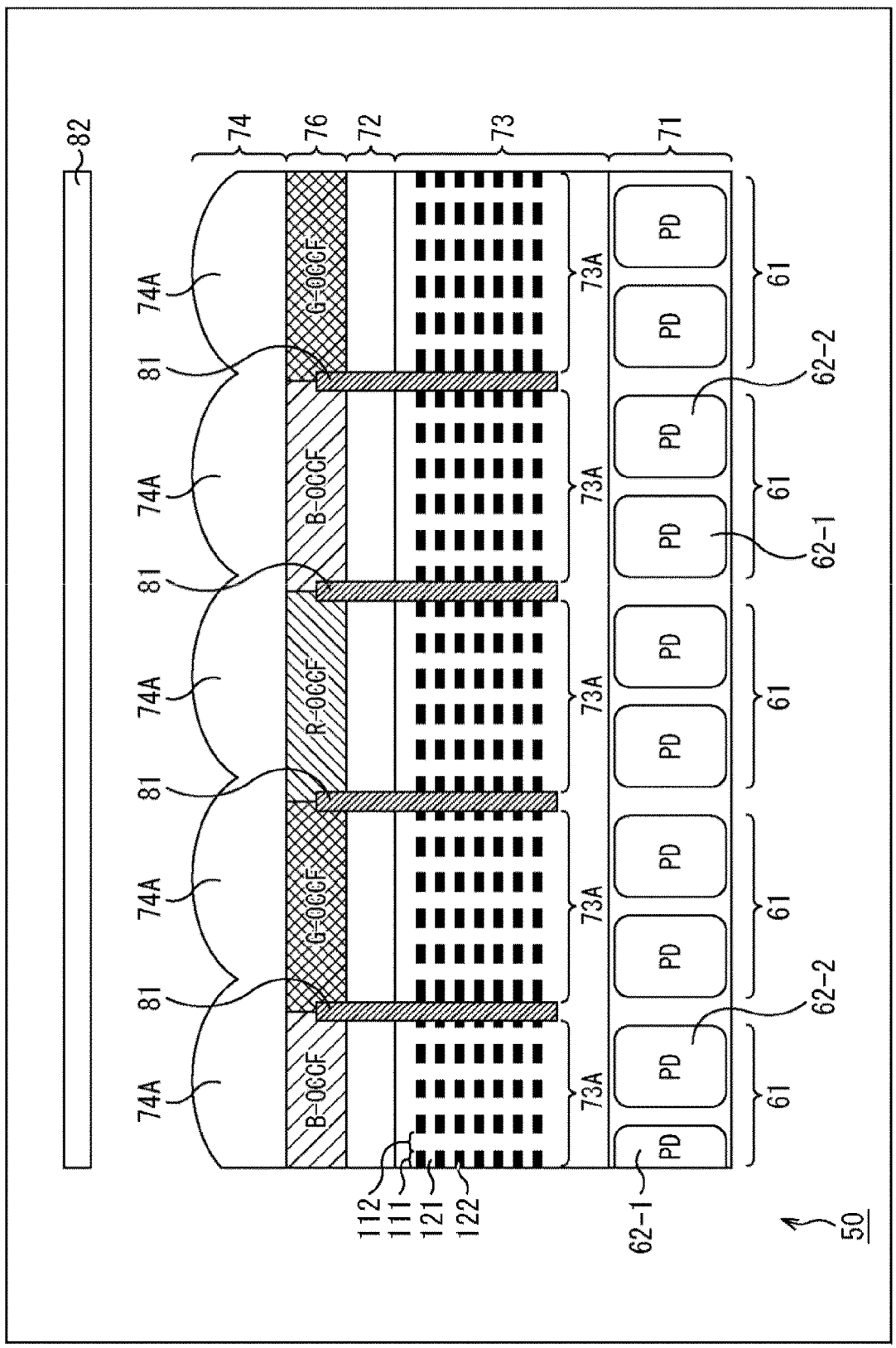
FIG. 9 is a sectional view depicting a second embodiment of the polarization image sensor of the present disclosure.

FIG. 9 is a sectional view of a polarization image sensor 50 as a second embodiment of the polarization image sensor of the present disclosure that implements the detection principle described hereinabove with reference to FIG. 3.

In the second embodiment of FIG. 9, elements corresponding to those of the first embodiment depicted in FIG. 4 are denoted by the same reference characters and description of them is omitted suitably.

Comparing the second embodiment of FIG. 9 with the first embodiment depicted in FIG. 4, the disposition of the flattened film 72 is changed from the lower side of the polarizer layer 73 to the upper side of the polarizer layer 73, and an OCCF layer 76 in which an R-OCCF (On Chip Color Filter), a G-OCCF, and a B-OCCF are disposed in a predetermined array is formed between the flattened film 72 and the OCL layer 74. The R-OCCF is an on chip color filter that transmits red light therethrough. The G-OCCF is an on chip color filter that transmits green light therethrough. The B-OCCF is an on chip color filter that transmits blue light therethrough. The flattened film 72 may be on any of the upper side and the lower side of the polarizer layer 73 or may be on both the upper side and the lower side.

Further, between a pixel 61 and another pixel 61 of the polarizer layer 73, the flattened film 72, and the OCCF layer 76, a light blocking wall 81 that does not transmit light therethrough is formed in order to suppress occurrence of color mixture. The light blocking wall 81 may be omitted.

Furthermore, on the upper side (light incidence side) in FIG. 9 with respect to the OCL layer 74, an IR cut filter 82 for blocking infrared components and transmitting only visible light therethrough is formed over all pixels. This IR cut filter 82 may be omitted.

It is to be noted that the division directions of the PDs 62-1 and 62-2, polarization directions of the polarizers 73A, and arraying method of R, G, and B in the OCCF layer 76 depicted in FIG. 9 are exemplary to the last and are not restrictive.

Although, in FIG. 9, as the configuration of the polarizer layer 73, an example of the configuration of the photonic crystal type depicted in FIGS. 5A and 5B are depicted, the configuration of the wire grid type depicted in FIG. 6 may otherwise be applied. Further, although the OCL 74A of the OCCF layer 76 is depicted as an example of that of a substantially spherical shape type in a unit of a pixel depicted in FIG. 8A, it may otherwise be of the lenticular type depicted in FIG. 8B.

Figure 10A:
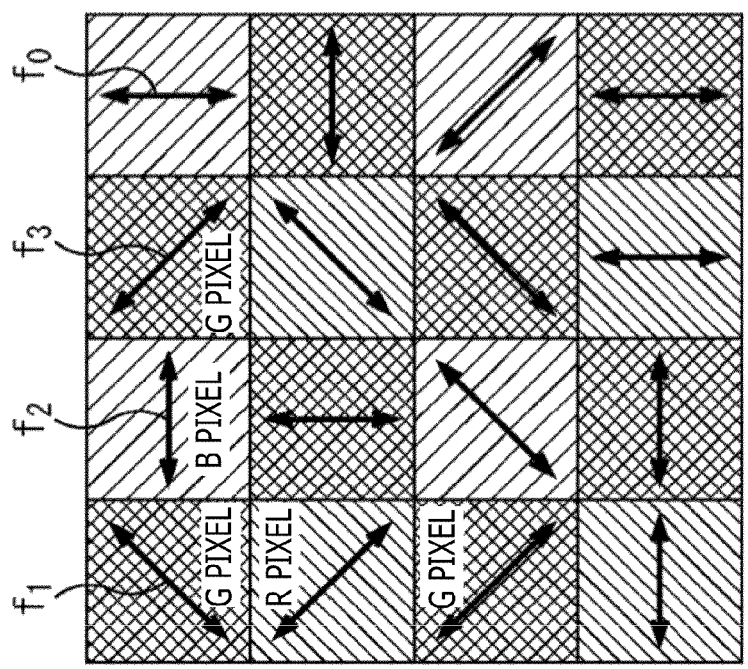
FIGS. 10A and 10B are views depicting an example of disposition of polarization directions of polarizers and an example of disposition of a division direction of two PDs in a pixel in the second embodiment.

FIG. 10A depicts an example of color disposition of R, G, and B of the OCCF layer 76 and an example of disposition of polarization directions of the polarizers 73A in the second embodiment.

The color disposition of R, G, and B of the OCL layer 74 is, for example, that of a Bayer (Bayer) array. Although it is a matter of course that the polarizers 73A are disposed such that polarization information of the four polarization directions $f_0$ to $f_3$ can be acquired in regard to each of the colors of R, G, and B, it is arrayed such that different pieces of polarization information of the polarization directions $f_0$ to $f_3$ can be obtained from adjacent pixels of the same colors of R, G, and B.

Figure 10B:
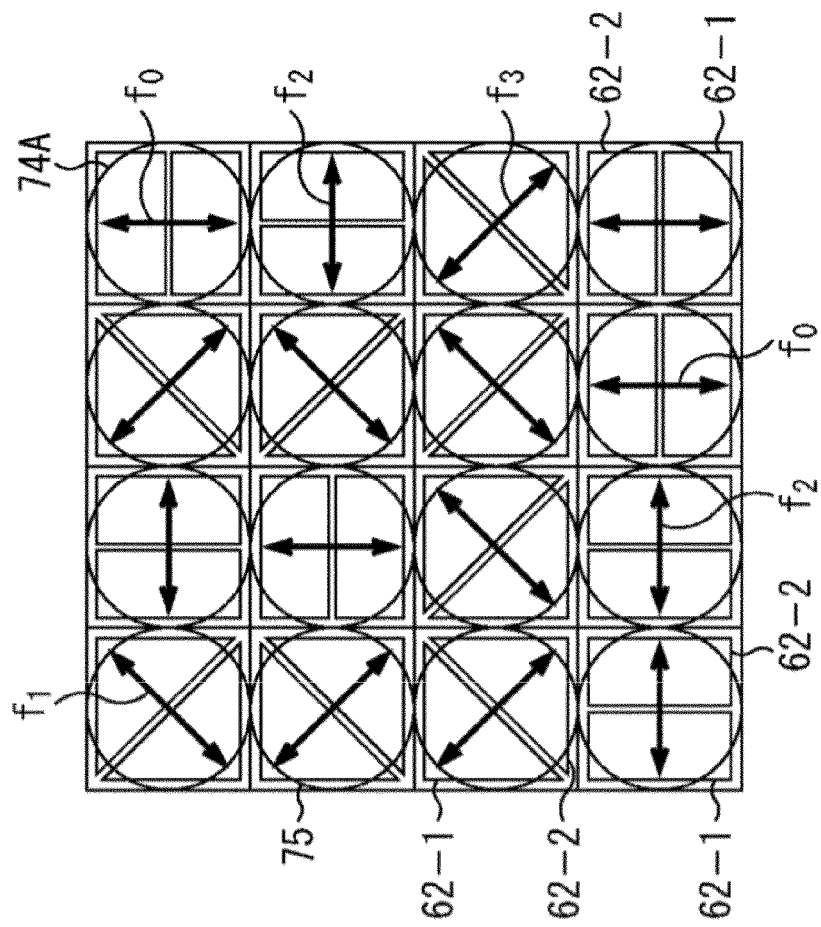

FIG. 10B depicts an example of disposition of the polarization directions of polarizers 73A and an example of disposition of the division directions of the two PDs 62-1 and 62-2 in pixels in the second embodiment.

Although the division directions of the two PDs 62-1 and 62-2 in a pixel can be made same directions as the polarization directions $f_0$ to $f_3$ of the polarizers 73A as depicted in FIG. 10B, they need not necessarily be the same directions.

According to the polarization image sensor 50 of the second embodiment configured in such a manner as described above, the detection principle described hereinabove with reference to FIG. 3 can be implemented similarly as in the first embodiment, and it is possible to estimate a normal vector on the surface of an imaging object to be imaged and estimate the surface and the shape of the imaging object.

Further, since the phase difference can be detected, also it is possible to determine the distance to the imaging object by the principle of triangulation. Therefore, by taking the distance information to points of an imaging object into consideration together, it is possible to estimate a particular shape of the imaging object with high accuracy. Further, the phase difference information can be used also as focus adjustment information for automatic focusing.

In addition, in the second embodiment, since the OCCF layer 76 in which an R-OCCF, a B-OCCF, and a B-OCCF are arrayed in a predetermined array such as the Bayer array is provided, an image signal of a color image can be outputted, and color information and polarization information of visible light can be acquired simultaneously.

<4. Third Embodiment of Polarization Image Sensor>

Figure 11:
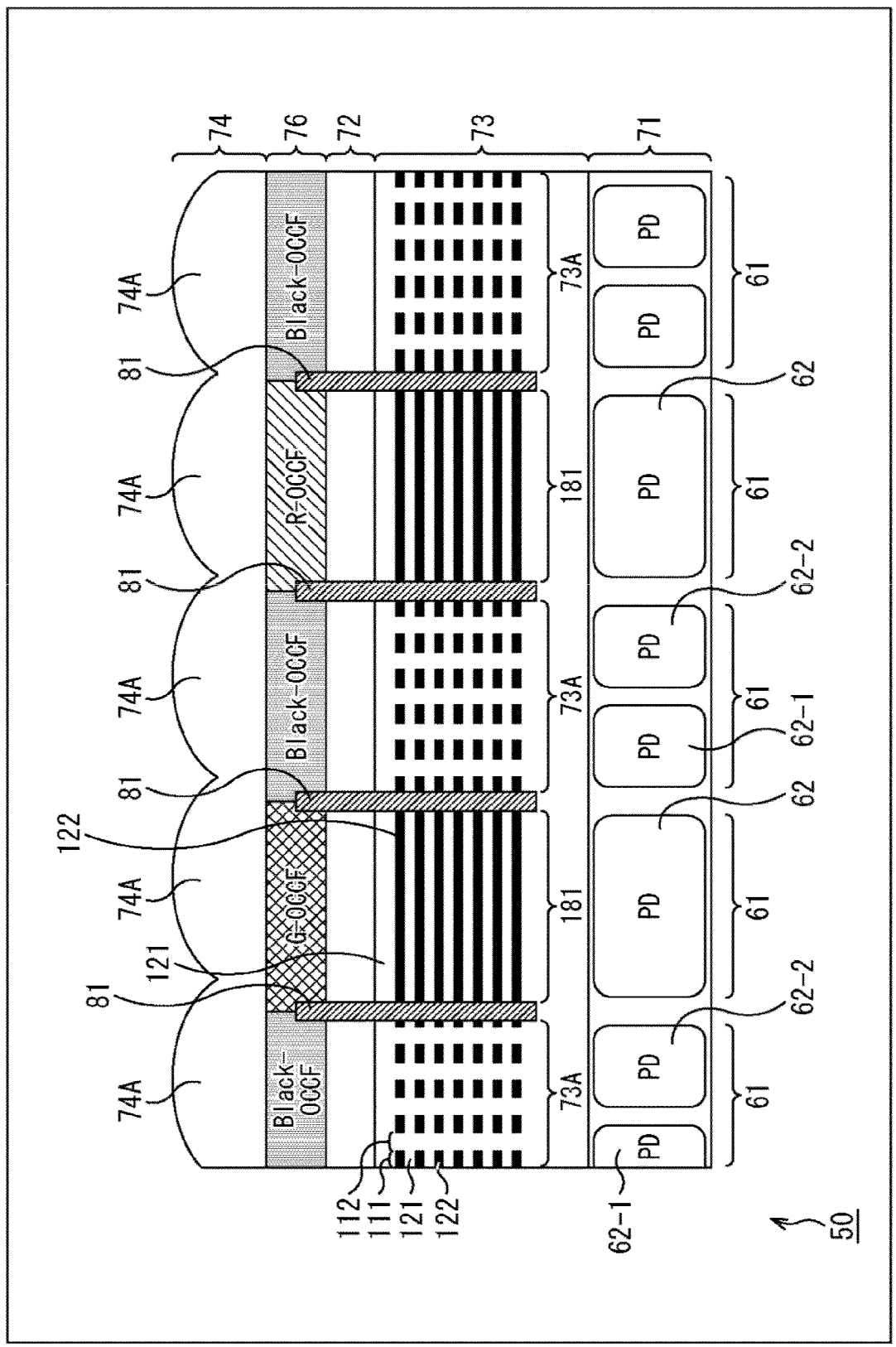
FIG. 11 is a sectional view depicting a third embodiment of the polarization image sensor of the present disclosure.

FIG. 11 is a sectional view of a polarization image sensor 50 as a third embodiment of the polarization image sensor of the present disclosure that implements the detection principle described hereinabove with reference to FIG. 3.

In the third embodiment of FIG. 11, elements corresponding to those of the second embodiment depicted in FIG. 9 are denoted by the same reference characters and description of them is omitted suitably.

Comparing the third embodiment of FIG. 11 with the second embodiment depicted in FIG. 9, the IR cut filter 82 disposed on the upper side (light incidence side) in FIG. 9 with respect to the OCL layer 74 in the second embodiment is omitted. Accordingly, in the third embodiment, visible light and infrared components of incidence light are introduced into the OCLs 74A.

Further, in the third embodiment, in each pixel of the OCCF layer 76, a Black-OCCF that blocks visible light and transmits infrared components therethrough is disposed in addition to an R-OCCF that transmits red light therethrough, a G-OCCF that transmits green light therethrough, and a B-OCCF that transmits blue light therethrough are disposed.

Further, the third embodiment is different from the second embodiment in that, in the polarizer layer 73, although a pixel 61 that has a Black-OCCF has disposed therein a polarizer 73A that transmits light of a predetermined polarization direction (polarized wave) therethrough, an IR cut filter 181 is disposed in a pixel 61 in which an R-OCCF, a G-OCCF, or a B-OCCF is disposed.

Figure 12:
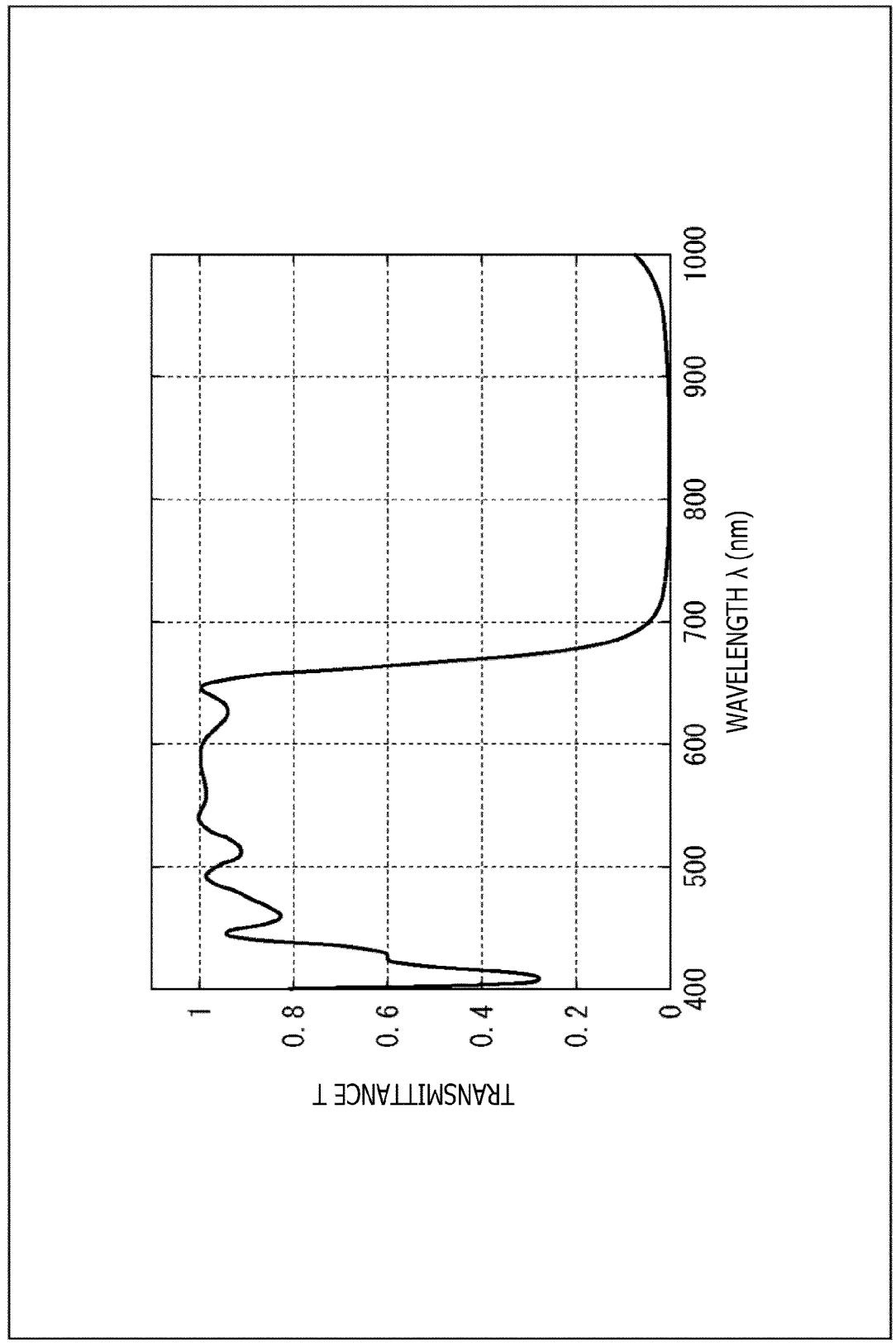
FIG. 12 is a view depicting a transmission spectral characteristic of an IR cut filter.

The IR cut filter 181 is configured in a structure in which a $SiO_2$ film 121 and a $TiO_2$ film 122 are stacked alternately similarly as in the polarizer 73A. The thickness cycle of the multilayer film (thickness of each film) configured from the $SiO_2$ film 121 and the $TiO_2$ film 122 is set to an appropriate cycle such that the IR cut filter 181 blocks infrared light but transmits visible light therethrough. Naturally, the thickness cycle of the multilayer film is arbitrary. FIG. 12 depicts a transmission spectral characteristic of the IR cut filter 181 formed from a multilayer film.

Further, although, in the PD 62 formed in the semiconductor layer 71, a pixel 61 on which the polarizer 73A is disposed has formed therein two divided PDs 62-1 and 62-2 similarly as in the second embodiment, in a pixel 61 in which the IR cut filter 181 is disposed, a single PD 62 having a light reception region equal to a total light reception region of the two PDs 62-1 and 62-2 is formed.

Accordingly, the pixel 61 in which the polarizer 73A and the Black-OCCF are disposed is an IR polarization pixel that blocks visible light and transmits infrared components therethrough and besides allows only a polarized wave of a predetermined polarization direction (any of the polarization directions $f_0$ to $f_3$) to be introduced into the PDs 62-1 and 62-2.

On the other hand, a pixel 61 in which the IR cut filter 181 and an R-OCCF, a G-OCCF, or a B-OCCF are disposed is a visible light pixel that transmits red light, green light, or blue light therethrough and besides allows the transmitted light to be introduced into the single PD 62 with infrared components of the same blocked.

Since the thickness cycle of the layer of the multilayer film configured from the $SiO_2$ films 121 and the $TiO_2$ films 122 is equal between the visible light pixels and the IR polarization pixels, it is possible to form the polarizers 73A and the IR cut filters 181 by stacking a multilayer film by vapor deposition, for example, by a sputtering method over an overall area of the pixel array section first, then forming the grooved portions 112 only in the area of the IR polarization pixels using lithography and RIE processing or the like and filling $SiO_2$ into the grooved portions 112.

Figure 13B:
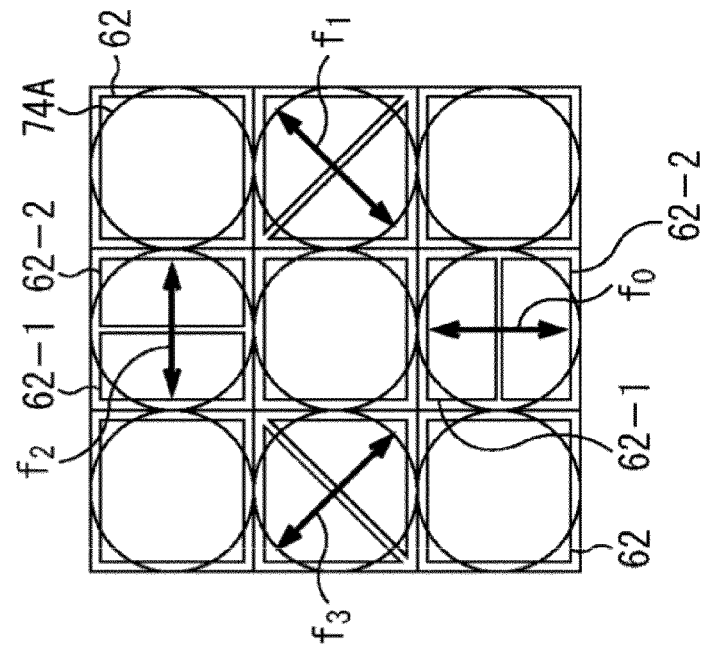
FIGS. 13A and 13B are views depicting an example of disposition of polarization directions of polarizers and an example of disposition of a division direction of two PDs in a pixel in the third embodiment.
Figure 13A:
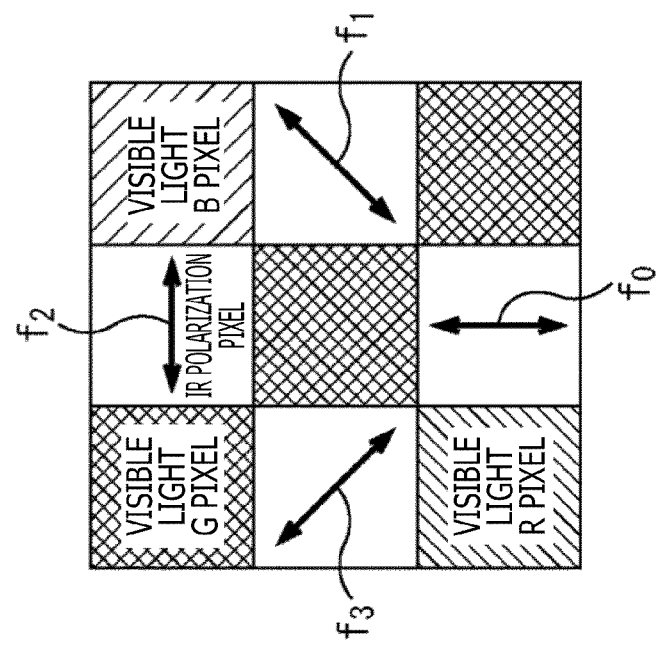

FIG. 13A depicts an example of disposition of IR polarization pixels and visible light pixels in the third embodiment.

Although the pixel array is arbitrary, for example, IR polarization pixels may be disposed in a checkered pattern while the other pixels are formed as visible light pixels (each as any of a visible light G pixel, a visible light B pixel, and a visible light R pixel) as depicted in FIG. 13A. In the case of the example of FIG. 13A, four IR polarization pixels are disposed in 3×3 pixels and are disposed such that the polarization directions of the IR polarization pixels are different from each other.

It is to be noted that at what ratio to nine pixels of 3×3 pixels IR polarization pixels are to be disposed is arbitrary.

FIG. 13B depicts an example of disposition of polarization directions of the polarizers 73A of the IR polarization pixels and an example of disposition of division directions of the two PDs 62-1 and 62-2 in the third embodiment.

Although the division directions of the two PDs 62-1 and 62-2 in a pixel can be made same directions as the polarization directions f0 to f3 of the polarizer 73A, for example, as depicted in FIG. 13B, they may not necessarily be same directions. Although, in a visible light pixel, a single PD 62 in which the two PDs 62-1 and 62-2 of the IR polarization pixel are united is formed, two PDs 62-1 and 62-2 may be formed similarly as in the IR polarization pixel.

According to the polarization image sensor 50 of the third embodiment configured in such a manner as described above, the detection principle described hereinabove with reference to FIG. 3 can be implemented similarly as in the first embodiment, and it is possible to estimate a normal vector on the surface of an imaging object to be imaged and estimate the surface and the shape of the imaging object.

Further, since the phase difference can be detected, also it is possible to determine the distance to the imaging object by the principle of triangulation. Therefore, by taking the distance information to points of an imaging object into consideration together, it is possible to estimate a particular shape of the imaging object with high accuracy. Further, the phase difference information can be used also as focus adjustment information for automatic focusing.

In addition, in the third embodiment, since the visible light pixels (visible light G pixels, visible light B pixels, and visible light R pixels) are provided, an image signal of a color image can be outputted, and color information and polarization information of visible light can be acquired simultaneously.

<5. Fourth Embodiment of Polarization Image Sensor>

Figure 14:
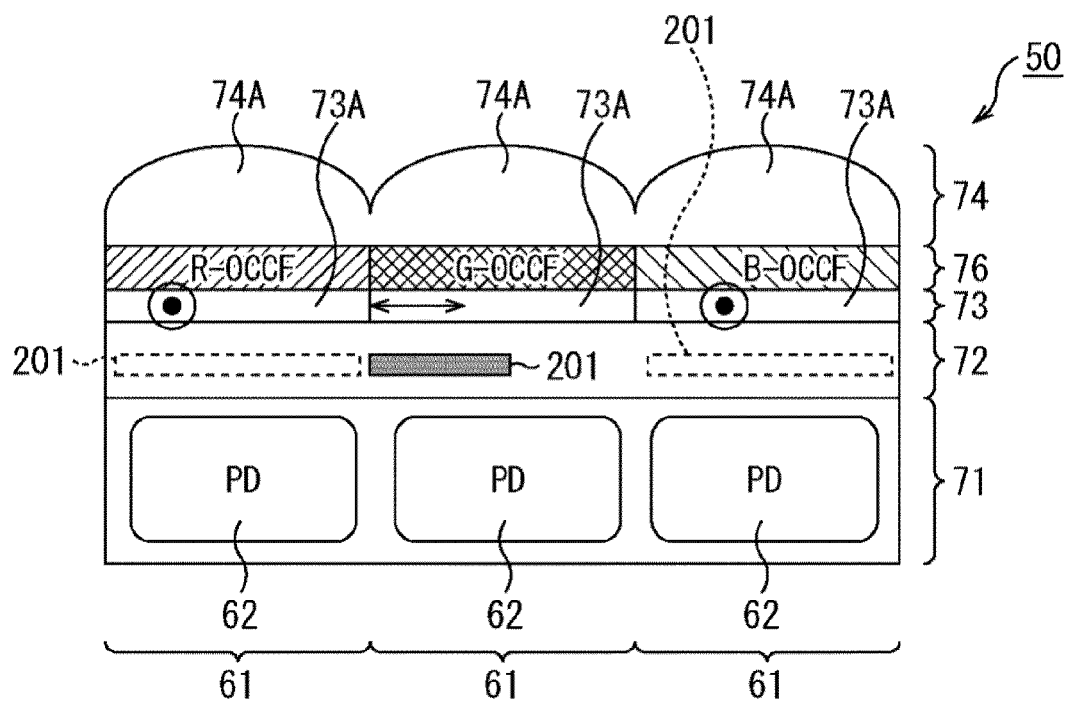
FIG. 14 is a sectional view depicting a fourth embodiment of the polarization image sensor of the present disclosure.

FIG. 14 is a sectional view of a polarization image sensor 50 as a fourth embodiment of the polarization image sensor of the present disclosure that implements the detection principle described hereinabove with reference to FIG. 3.

In the fourth embodiment of FIG. 14, elements corresponding to those of the first embodiment depicted in FIG. 4 are denoted by the same reference characters and description of them is omitted suitably.

In the fourth embodiment, an OCCF layer 76 in which an R-OCCF, a G-OCCF, and a B-OCCF are disposed in a predetermined array are newly formed on the upper side of the polarizer layer 73.

Further, in each pixel 61 of the semiconductor layer 71, a single PD 62 having a region equal to the total light reception region of the two PDs 62-1 and 62-2 of the first embodiment is formed, and instead, a light blocking film 201 that blocks part of incidence light to enter the PD 62 is formed at part of the flattened film 72. In particular, in each pixel 61 of the fourth embodiment, part of incidence light to enter the PD 62 is blocked by the light blocking film 201 such that a light reception region similar to that in the case where only one of the two PDs 62-1 and 62-2 of the first embodiment is formed is formed.

It is to be noted that, while, in FIG. 14, the light blocking film 201 is disposed on the lower side of the polarizer layer 73, it may otherwise be disposed on the upper side of the polarizer layer 73.

On the center pixel 61 among the three pixels 61 depicted in FIG. 14, the light blocking film 201 is formed such that one half in the horizontal direction of an overall light reception region of the PD 62 becomes a light reception region. On the pixels 61 on the right end and the left end, the light blocking film 201 is formed such that one half in the depthwise direction of the overall light reception region of the PD 62 becomes a light reception region.

Figure 15:
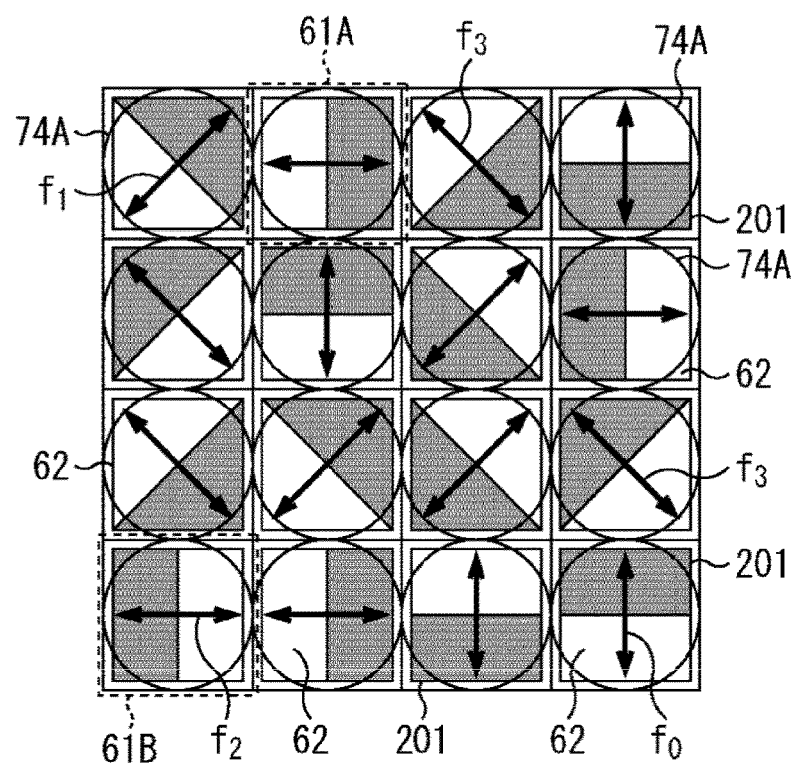
FIG. 15 is a sectional view depicting an example of disposition of polarization directions of polarizers and an example of disposition of light blocking films in the fourth embodiment.

FIG. 15 depicts an example of disposition of polarization directions of the polarizers 73A and an example of disposition of the light blocking films 201 in the fourth embodiment.

Although the division direction of a light reception region and a light non-reception region of each PD 62 formed by the light blocking film 201 can be made same as the polarization directions $f_0$ to $f_3$ of the polarizer 73A as depicted in FIG. 15, it need not necessarily be the same direction.

In the fourth embodiment, since signals obtained by a set of two pixels 61 in regard to which the light blocking regions of the light blocking films 201 are symmetrical to each other like the pixels 61A and 61B indicated by broken lines become equivalent to signals obtained by the two PDs 62-1 and 62-2 of the pixel 61 in the first embodiment, by forming the light blocking film 201, an advantageous effect similar to that in the first embodiment can be achieved without dividing the PD 62 into two.

According to the polarization image sensor 50 of the fourth embodiment configured in such a manner as described above, the detection principle described hereinabove with reference to FIG. 3 can be implemented, and it is possible to estimate a normal vector on the imaging object surface to be imaged and estimate the surface and the shape of an imaging object similarly as in the first embodiment.

Further, since the phase difference can be detected, also it is possible to determine the distance to the imaging object by the principle of triangulation. Therefore, by taking the distance information to points of an imaging object into consideration together, it is possible to estimate a particular shape of the imaging object with high accuracy. Further, the phase difference information can be used also as focus adjustment information for automatic focusing.

In addition, in the fourth embodiment, since the OCCF layer 76 in which an R-OCCF, a G-OCCF, and a B-OCCF are disposed in a predetermined array such as the Bayer array, an image signal of a color image can be outputted, and color information and polarization information of visible light can be acquired simultaneously.

<6. Example of Application to Electronic Apparatus>

The polarization image sensor described above can be applied to imaging apparatus (camera system) such as, for example, a digital still camera or a digital video camera, portable telephone sets having an image pickup function, or various kinds of electronic apparatuses having an image pickup function.

Figure 16:
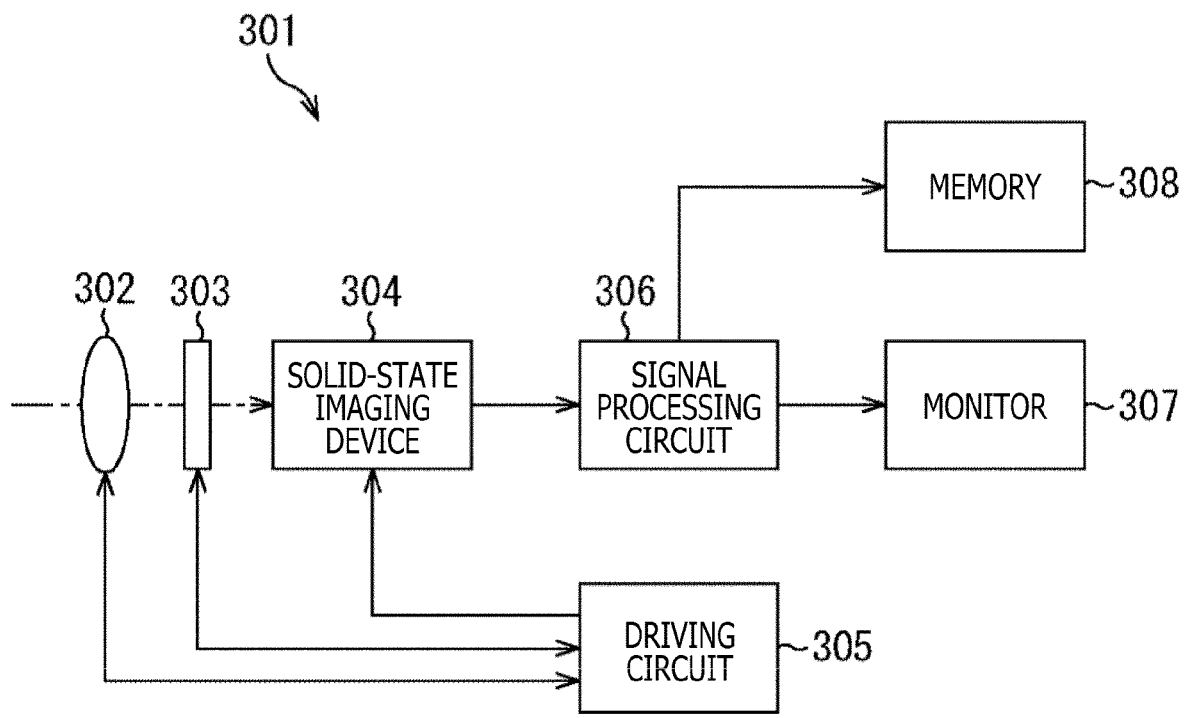
FIG. 16 is a block diagram depicting an example of a configuration of an imaging apparatus as an electronic apparatus to which the technology according to the present disclosure is applied.

FIG. 16 is a block diagram depicting an example of a configuration of an imaging apparatus as an electronic apparatus to which the technology according to the present disclosure.

An imaging apparatus 301 depicted in FIG. 16 is configured including an optical system 302, a shutter device 303, a solid-state imaging device 304, a driving circuit 305, a signal processing circuit 306, a monitor 307, and a memory 308, and is capable of capturing a still image and a moving image.

The optical system 302 is configured including one or a plurality of lenses, and introduces light (incident light) from an imaging object to the solid-state imaging device 304 such that an image is formed on a light reception face of the solid-state imaging device 304. At least one focus lens in the optical system 302 is moved in a direction of an optical axis in accordance with a driving signal from the driving circuit 305.

The shutter device 303 is disposed between the optical system 302 and the solid-state imaging device 304 and controls a light irradiation period and a light blocking period to the solid-state imaging device 304 under the control of the driving circuit 305.

The solid-state imaging device 304 is configured from the polarization image sensor 50 described hereinabove. The solid-state imaging device 304 accumulates signal charge for a fixed period in response to light with which an image is formed on the light reception face through the optical system 302 and the shutter device 303. The signal charge accumulated in the solid-state imaging device 304 is transferred in accordance with a driving signal (timing signal) supplied from the driving circuit 305 and outputted as an image signal to the signal processing circuit 306. The solid-state imaging device 304 may be configured as one chip by itself or may be configured as part of a camera module in which it is packaged together with the optical system 302 to signal processing circuit 306 and so forth.

The driving circuit 305 outputs driving signals for controlling transfer operation of the solid-state imaging device 304 and shutter operation of the shutter device 303 to drive the solid-state imaging device 304 and the shutter device 303.

The signal processing circuit 306 performs various signal processes for an image signal outputted from the solid-state imaging device 304. For example, the signal processing circuit 306 performs a process for calculating a normal vector on the imaged imaging object surface using the image signal outputted from the solid-state imaging device 304 and detecting (estimating) a surface and a shape of the imaging object. Further, the signal processing circuit 306 detects a phase difference based on image signals outputted from the solid-state imaging device 304, especially based on image signals outputted from symmetrical light reception regions, to calculate the distance to the imaging object. The distance information to the imaging object calculated by the signal processing circuit 306 is supplied, for example, to the driving circuit 305, and the driving circuit 305 controls the optical system 302 on the basis of the distance information.

An image (image data) obtained by signal processing performed by the signal processing circuit 306 is supplied to and displayed on the monitor 307 or supplied to and stored (recoded) into the memory 308.

According to the imaging apparatus 301 configured in such a manner, by adopting the polarization image sensor 50 described hereinabove as the solid-state imaging device 304, it is possible to estimate a normal vector on an imaged imaging object surface and estimate a surface and a shape of the imaging object.

<7. Example of Application to Biometric Authentication Device>

Further, the polarization image sensor 50 described above can be applied also to a biometric authentication device that performs biometric authentication, for example, utilizing optics.

Figure 17:
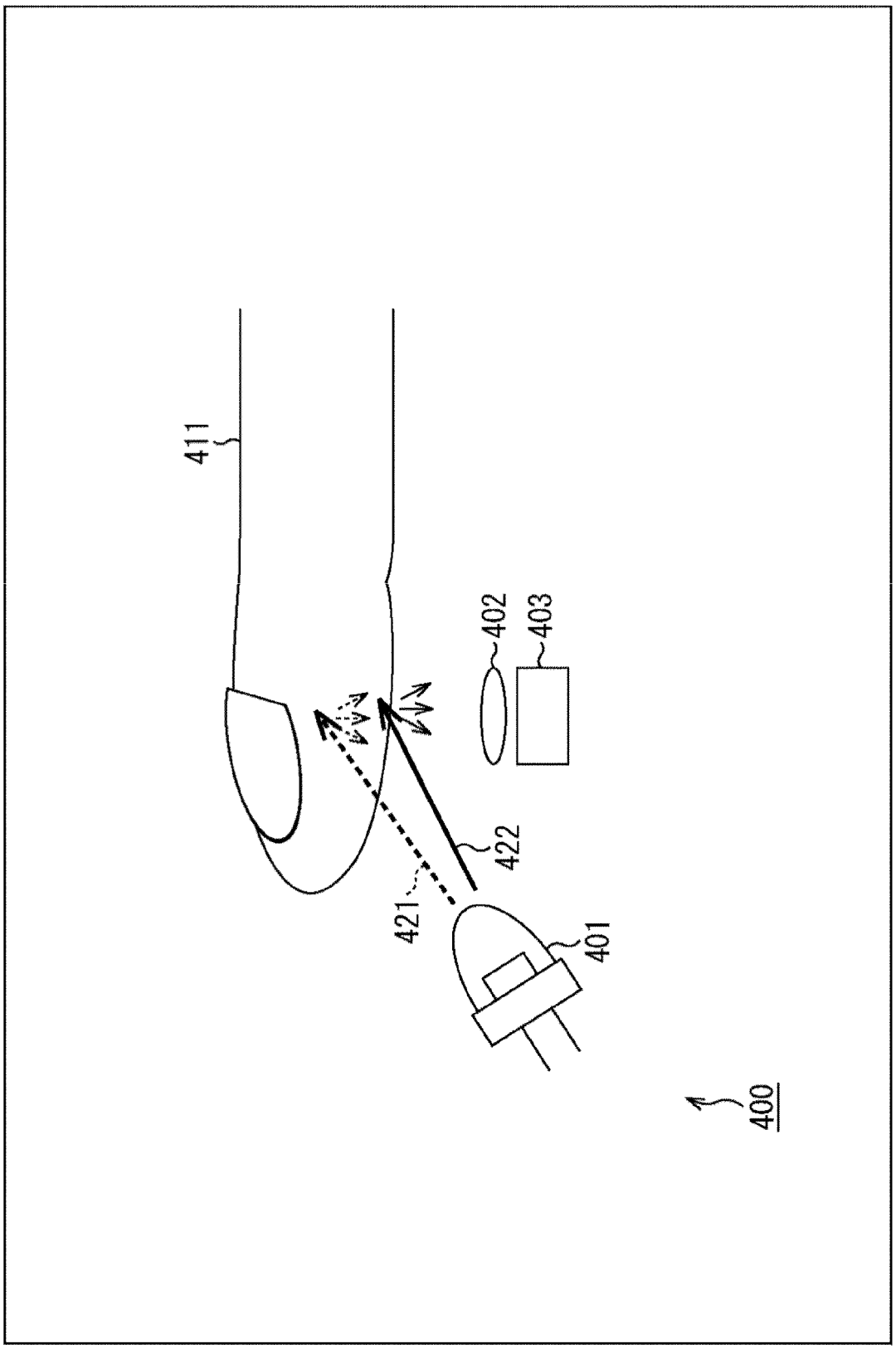
FIG. 17 is a view depicting an example of a principal configuration of a biometric authentication device to which the technology according to the present disclosure is applied.

FIG. 17 depicts an example of a principal configuration of a biometric authentication device to which the technology according to the present disclosure is applied.

The biometric authentication device 400 depicted in FIG. 17 is a system that allows fingerprint authentication and vein authentication simultaneously for a living body 411 such as a finger to prevent impersonation authentication. It is to be noted that skin surface shape authentication of the palm or the like may be performed in place of fingerprint authentication.

The biometric authentication device 400 includes a light emission section 401, an imaging lens 402, and an image sensor 403. The light emission section 401 includes a two-wavelength band LED or the like that can emit light of two wavelength bands such as, for example, visible light of blue to green and near infrared light. The image sensor 403 received reflection light of such light reflected by the living body 411 through the imaging lens 402. As the image sensor 403, the polarization image sensor 50 described hereinabove is adopted.

Light incident from the skin is subject less likely to scattering or absorption as the wavelength thereof becomes long, and the light penetrates deep into the skin. After the light penetrates deep into the skin, it is scattered midway of the light path and returns spreading. In the case where light returns from the depth in such a manner, the light becomes background light when the skin surface is imaged, resulting in degradation of the resolution. Accordingly, it is favorable for imaging of the skin surface if the wavelength is made short as far as possible in the visible light range. In contrast, in the case where a venous blood vessel existing at a depth, for example, up to approximately 2 mm is to be imaged, light on the short wavelength side does not reach the depth, but light on the long wavelength side reaches the depth.

Therefore, a vein can be imaged with high picture quality principally using near infrared light on the longer wavelength side than the wavelength of 650 nm. In short, the image sensor 403 detects (receives and photoelectrically converts) near infrared light 421 emitted from the light emission section 401 and reflected by the inside of the living body 411 through the imaging lens 402. Further, the image sensor 403 detects (receives and photoelectrically converts) visible light (blue to green) 422 emitted from the light emission section 401 and reflected by the surface of the living body 411 through the imaging lens 402.

Further, since a vein absorbs near infrared light by hemoglobin, the returning light is weaker and is recognized as a dark line. However, if light scattered in and returning from the inside is strong, then this gives rise to degradation of the image contrast. Further, even infrared light is subject to reflection by the skin surface, and also this gives rise to deterioration of the image contrast. Accordingly, for the object of suppression of surface reflection and light scattering, in vein image acquisition, acquisition of a polarized light image is applicable. By using the polarization image sensor 50 described hereinabove as the image sensor 403, a fingerprint, a surface shape of the palm or the like or a vein shape can be grasped accurately.

<8. Example of Application to In-Vivo Information Acquisition System>

The technology according to the present disclosure (present technology) can be applied to various products. For example, the technology according to the present disclosure may be applied to a patient in-vivo information acquisition system using a capsule type endoscope.

Figure 18:
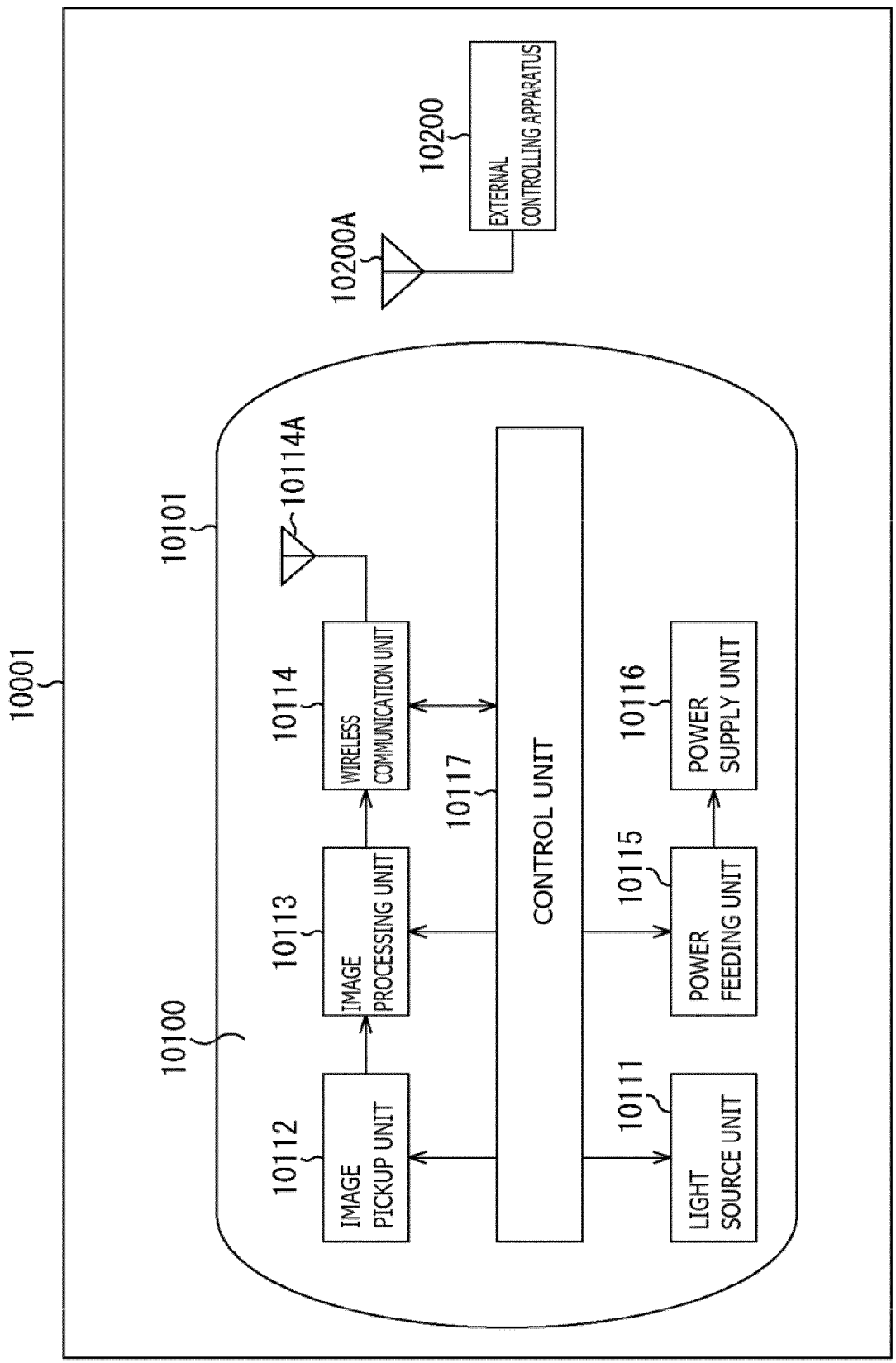
FIG. 18 is a block diagram depicting an example of a schematic configuration of an in-vivo information acquisition system.

FIG. 18 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 18, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure can be applied has been described. The technology according to the present disclosure can be applied to the image pickup unit 10112 from within the configuration described hereinabove. In particular, as the image pickup unit 10112, the polarization image sensor 50 according to the embodiments described hereinabove can be applied. By applying the technology according to the present disclosure to the image pickup unit 10112, an image in which the surface and the shape of a surgical region as an imaging object are clearer can be obtained, and therefore, the accuracy in inspection is improved.

<9. Example of Application to Endoscopic Surgery System>

The technology according to the present disclosure (present technology) can be applied to various products. For example, the technology according to the present disclosure may be applied to an endoscopic surgery system.

Figure 19:
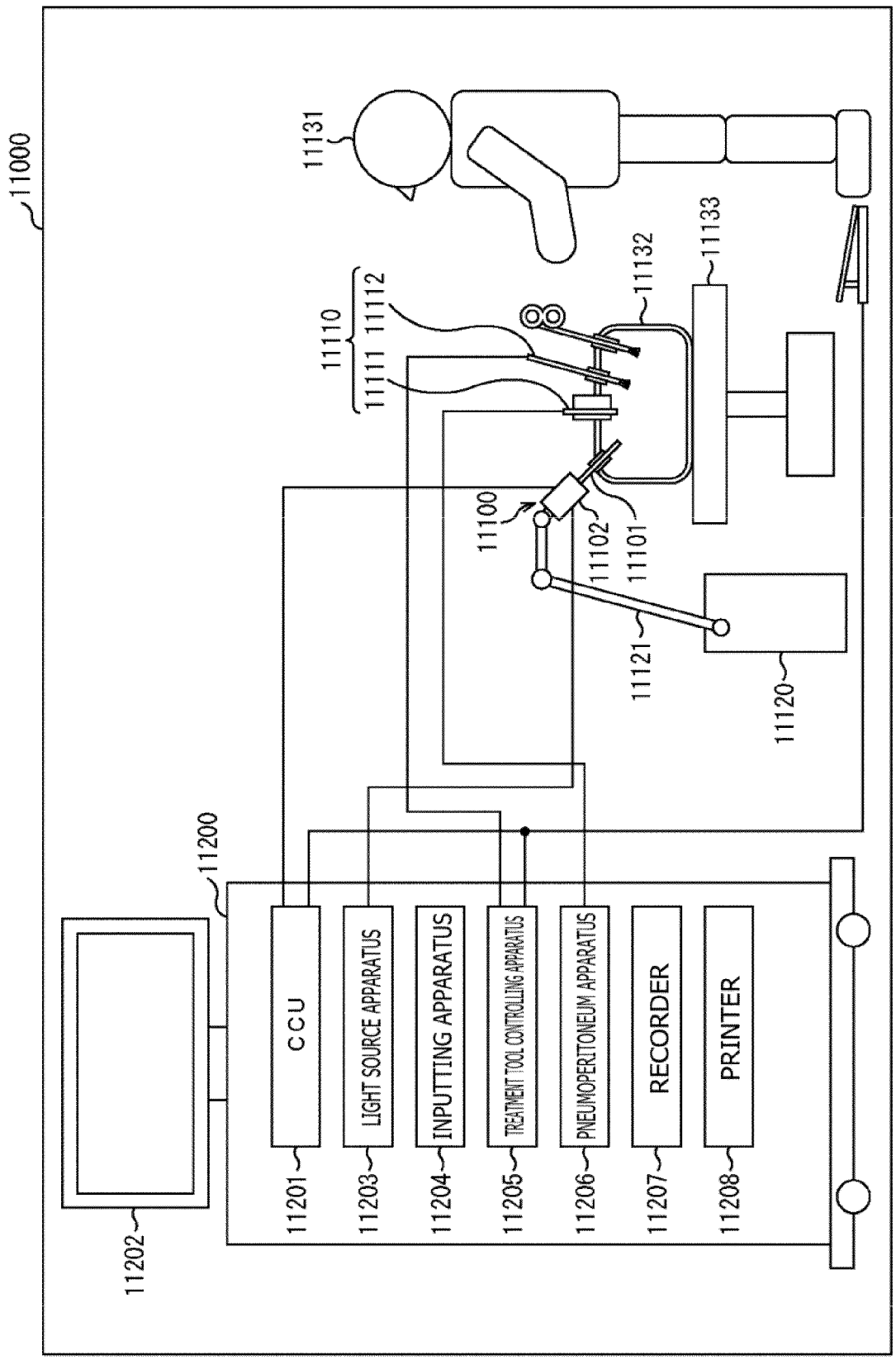
FIG. 19 is a view depicting an example of a schematic configuration of an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 20:
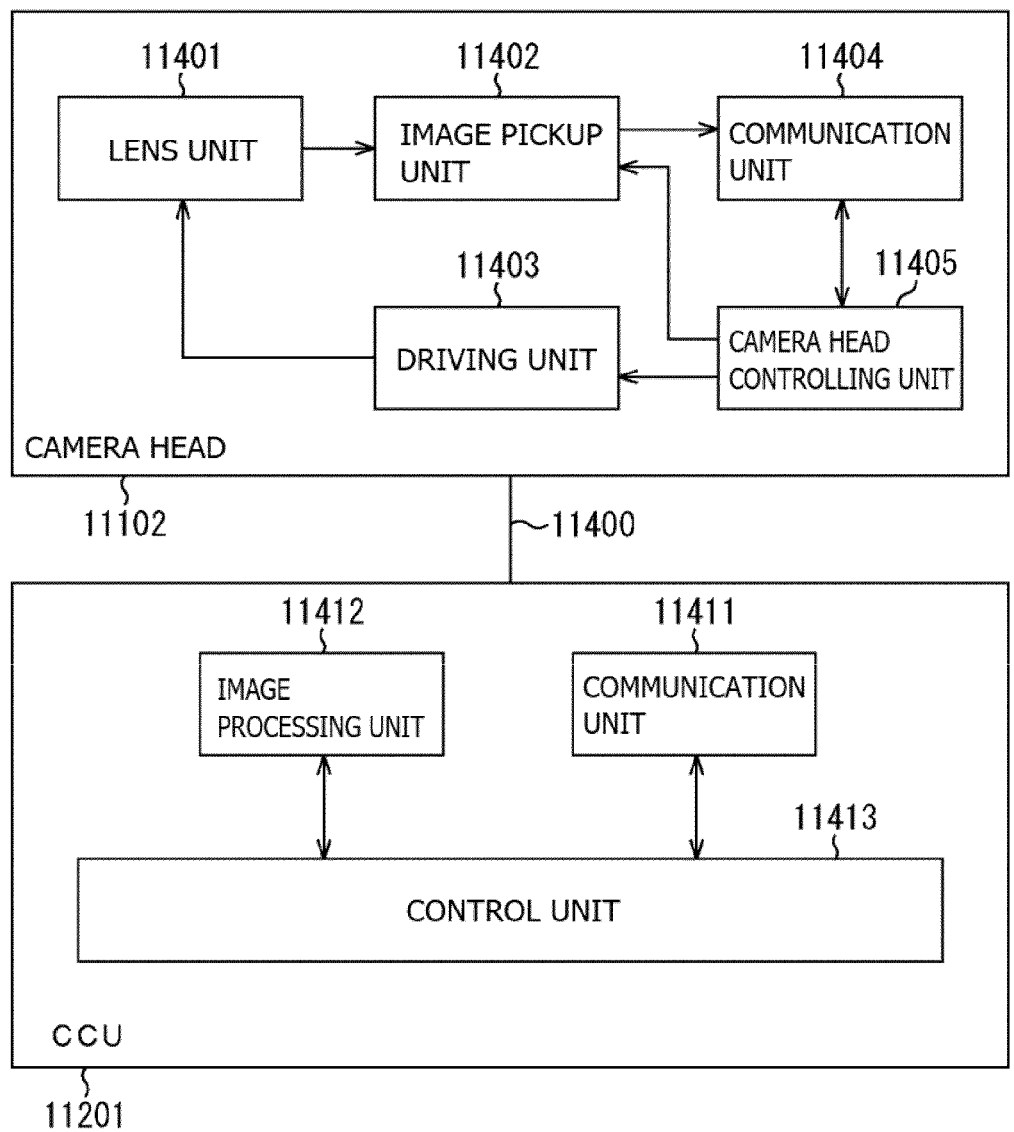
FIG. 20 is a block diagram depicting an example of a functional configuration of a camera head and a camera control unit (CCU).

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described. The technology according to the present disclosure can be applied to the image pickup unit 11402 of the camera head 11102. In particular, as the image pickup unit 11402, the polarization image sensor 50 according to the embodiments described above can be applied. By applying the technology according to the present disclosure to the image pickup unit 11402, an image in which the surface and the shape of a surgical region as an imaging object are clearer can be obtained.

It is to be noted that, although an endoscopic surgery system has been described as an example here, the technology according to the present disclosure may be applied further, for example, to a microsurgery system or the like.

<10. Example of Application to Mobile Body>

The technology according to the present disclosure (present technology) can be applied to various products. For example, the technology according to the present disclosure can be implemented as an apparatus that is incorporated in a kind of a mobile body such as an automobile, an electric car, a hybrid electric car, a motorcycle, a bicycle, a personal mobility, an airplane, a drone, a ship, or a robot.

Figure 21:
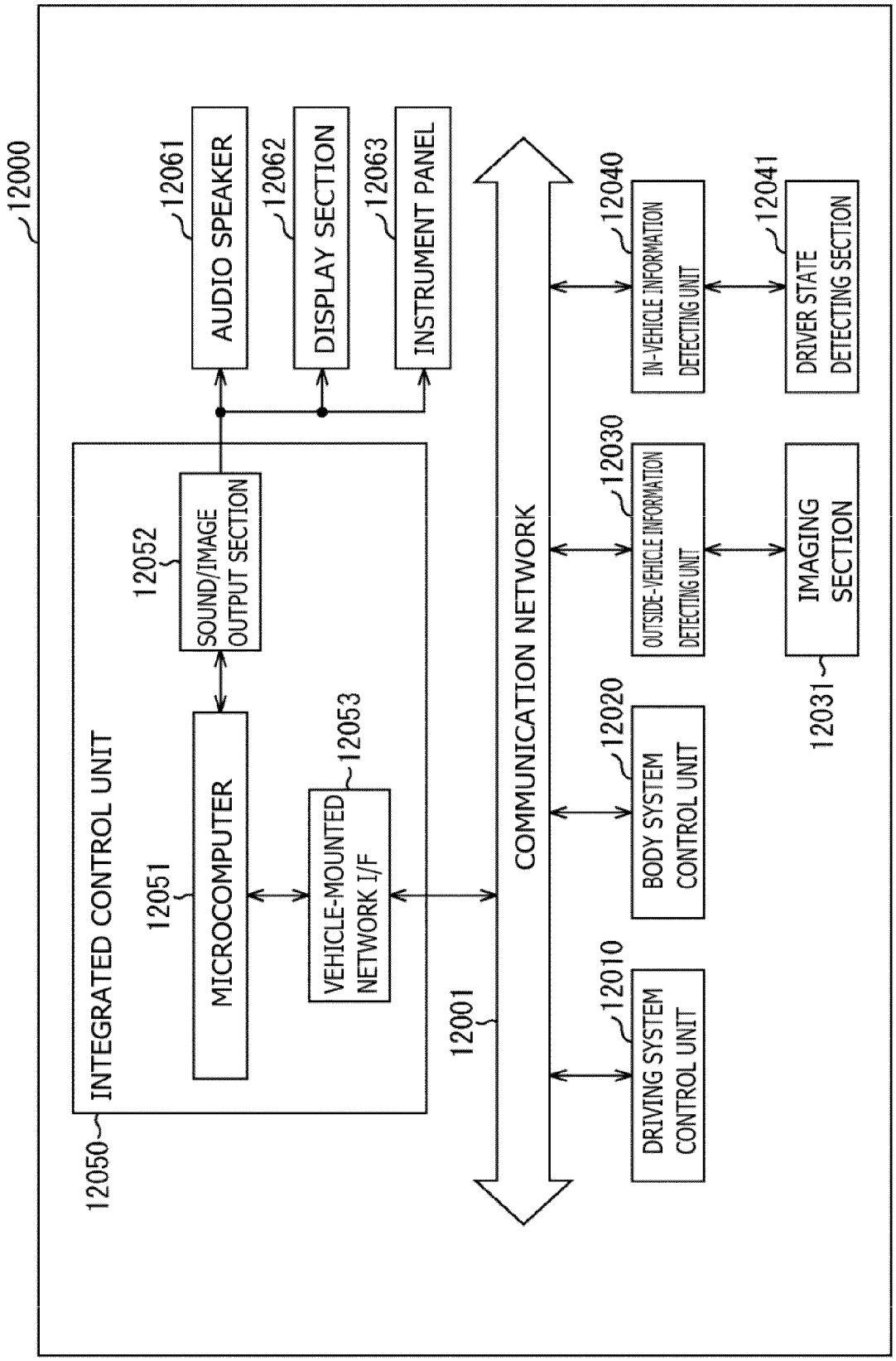
FIG. 21 is a block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
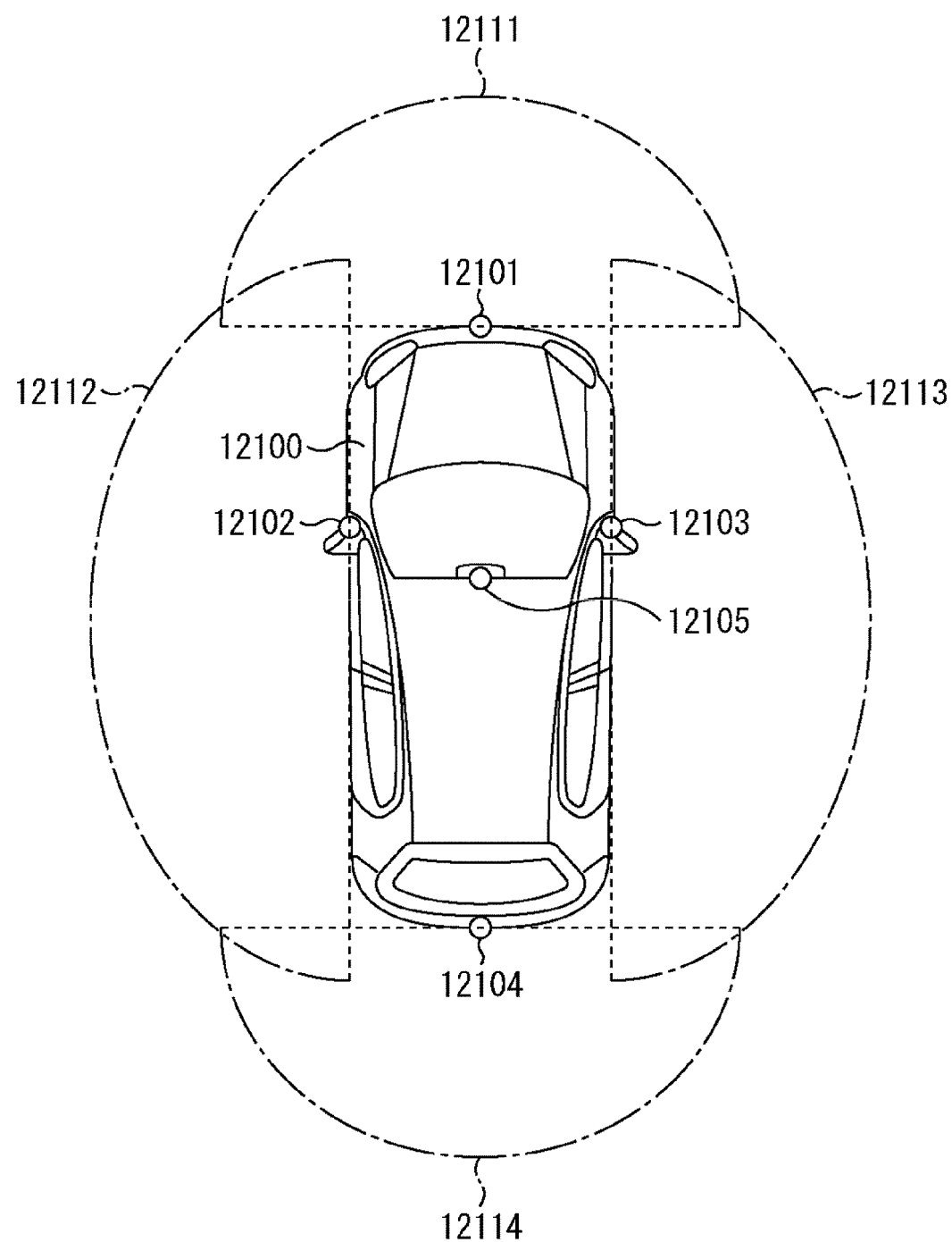
FIG. 22 is a diagram of assistance in explaining an example of installation positions of an outside-vehicle information detecting section and an imaging section.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described. The technology according to the present disclosure can be applied to the imaging section 12031 from within the configuration described above. In particular, the polarization image sensor 50 according to the embodiments described above can be applied as the imaging section 12031. By applying the technology according to the present disclosure to the imaging section 12031, distance information and shape information of an imaging object such as an obstacle can be estimated accurately, and it is possible to improve the safety level of a driver or a vehicle using a result of the estimation.

The embodiment of the present technology is not limited to the embodiments described hereinabove and can be modified in various manners without departing from the subject matter of the technology according to the present technology.

For example, it is possible to adopt a form in which all or part of the plurality of embodiments described above are suitably combined.

It is to be noted that the advantageous effects described in the present specification are exemplary to the last and are not restrictive, and advantageous effects in addition to those described in the present specification may be applicable.

It is to be noted that the present technology can take such configurations as described below.

(1)

A solid-state imaging device, including:

a plurality of polarizers disposed on a chip and having different polarization directions; and a plurality of photoelectric conversion sections having light reception regions for receiving light transmitted through the polarizers, the light reception regions being symmetrical.

(2)

The solid-state imaging device according to (1) above, in which the plurality of photoelectric conversion sections includes two photodiodes formed under an on-chip lens of one pixel.

(3)

The solid-state imaging device according to (1) above, in which the plurality of photoelectric conversion sections includes two photodiodes formed under an on-chip lens of a plurality of pixels.

(4)

The solid-state imaging device according to (2) or (3) above, in which the on-chip lens includes a lens of a substantially spherical shape.

(5)

The solid-state imaging device according to (3) above, in which the on-chip lens includes a lenticular type lens.

(6)

The solid-state imaging device according to any one of (1) to (5) above, in which the plurality of photoelectric conversion sections includes photodiodes formed in different pixels; and part of a light reception region of the photodiodes is covered with a light blocking film.

(7)

The solid-state imaging device according to any one of (1) to (6) above, in which the polarizers include polarizers of a photonic crystal type.

(8)

The solid-state imaging device according to any one of (1) to (6) above, in which the polarizers include polarizers of a wire grid type.

(9)

The solid-state imaging device according to any one of (1) to (8) above, in which each of the plurality of polarizers transmits light of one of four polarization directions.

(10)

The solid-state imaging device according to any one of (1), (2), and (7) to (9) above, in which the plurality of photoelectric conversion sections includes two photodiodes formed divisionally in one pixel, and division directions of the two photodiodes and polarization directions of the polarizer coincide with each other.

(11)

An electronic apparatus, including:

a solid-state imaging device including a plurality of polarizers disposed on a chip and having different polarization directions, and a plurality of photoelectric conversion sections having light reception regions for receiving light transmitted through the polarizers, the light reception regions being symmetrical.

(12)

The electronic apparatus according to (11) above, further including:

a signal processing circuit configured to calculate a normal vector on an imaging object surface on the basis of an image signal outputted from the solid-state imaging device and estimate a surface and a shape of the imaging object.

(13)

The electronic apparatus according to (11) or (12) above, further including:

a signal processing circuit configured to calculate a distance to an imaging object on the basis of an image signal outputted from the solid-state imaging device.

(14)

The electronic apparatus according to any one of (11) to (13), wherein an imaging object to be imaged by the solid-state imaging device includes a living body.

REFERENCE SIGNS LIST

50 Polarization image sensor, 61 Pixel, 62 PD, 71 Semiconductor layer (semiconductor chip), 72 Flattened film, 73 Polarizer layer, 73A Polarizer, 74 OCL layer, 74A OCL, 76 OCCF layer, 81 Light blocking wall, 82 IR cut filter, 201 Light blocking film, 301 Imaging apparatus, 304 Solid-state imaging device, 306 Signal processing circuit

The invention claimed is:

1. A solid-state imaging device, comprising:

a plurality of polarizers disposed on a chip and having different polarization directions; and a plurality of photoelectric conversion sections having light reception regions to receive light transmitted through the plurality of polarizers, wherein the light reception regions are symmetrical, and wherein each of the plurality of photoelectric conversion sections includes two photodiodes formed divisionally in one or more pixels, and a division direction of the two photodiodes is same as a polarization direction of a corresponding polarizer of the plurality of polarizers.

2. The solid-state imaging device according to claim 1, wherein the two photodiodes are formed under an on-chip lens of one pixel.

3. The solid-state imaging device according to claim 1, wherein
the two photodiodes are formed under an on-chip lens of a plurality of pixels.

4. The solid-state imaging device according to claim 2, wherein
the on-chip lens includes a lens of a substantially spherical shape.

5. The solid-state imaging device according to claim 3, wherein
the on-chip lens includes a lenticular type lens.

6. The solid-state imaging device according to claim 1, wherein
the two photodiodes are formed in different pixels.

7. The solid-state imaging device according to claim 1, wherein
the plurality of polarizers includes polarizers of a photonic crystal type.

8. The solid-state imaging device according to claim 1, wherein
the plurality of polarizers includes polarizers of a wire grid type.

9. The solid-state imaging device according to claim 1, wherein
each of the plurality of polarizers transmits light of one of four polarization directions.

10. An electronic apparatus, comprising:
a solid-state imaging device including:
a plurality of polarizers disposed on a chip and having different polarization directions, and
a plurality of photoelectric conversion sections having light reception regions to receive light transmitted through the plurality of polarizers, wherein the light reception regions are symmetrical, and wherein each of the plurality of photoelectric conversion sections includes two photodiodes formed divisionally in one or more pixels, and a division direction of the two photodiodes is same as a polarization direction of a corresponding polarizer of the plurality of polarizers.

11. The electronic apparatus according to claim 10, further comprising:
a signal processing circuit configured to calculate a normal vector on a surface of an imaging object on a basis of an image signal outputted from the solid-state imaging device and estimate the surface and a shape of the imaging object.

12. The electronic apparatus according to claim 10, further comprising:
a signal processing circuit configured to calculate a distance to an imaging object on a basis of an image signal outputted from the solid-state imaging device.

13. The electronic apparatus according to claim 10, wherein
an imaging object to be imaged by the solid-state imaging device includes a living body.

14. The solid-state imaging device according to claim 1, wherein the two photodiodes that are formed divisionally in the one or more pixels receive the light from two different directions to enable imaging from the two different directions.

15. The solid-state imaging device according to claim 1, wherein the two photodiodes that are formed divisionally in the one or more pixels are symmetrical in a depthwise direction.

16. The solid-state imaging device according to claim 1, wherein the two photodiodes that are formed divisionally in the one or more pixels are symmetrical in a horizontal direction.

17. A solid-state imaging device, comprising:
a plurality of polarizers disposed on a chip and having different polarization directions; and
a plurality of photoelectric conversion sections having light reception regions to receive light transmitted through the plurality of polarizers, wherein the light reception regions are symmetrical, wherein each of the plurality of photoelectric conversion sections includes a photodiode, and wherein
a part of a light reception region of the photodiode is covered with a light blocking film to form a light non-reception region, and
a division direction of remaining part of the light reception region of the photodiode and the light non-reception region is same as a polarization direction of a corresponding polarizer of the plurality of polarizers.

* * * * *